United States Patent
Kido et al.

(10) Patent No.: US 7,307,894 B2
(45) Date of Patent: Dec. 11, 2007

(54) SEMICONDUCTOR DEVICE AND CONTROL METHOD OF THE SAME

(75) Inventors: Kazunari Kido, Kanagawa (JP); Kazuhiro Kurihara, Tokyo (JP); Minoru Yamashita, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 33 days.

(21) Appl. No.: 11/127,712

(22) Filed: May 12, 2005

(65) Prior Publication Data

US 2005/0254316 A1   Nov. 17, 2005

Related U.S. Application Data

(63) Continuation of application No. PCT/JP2004/006374, filed on May 12, 2004.

(51) Int. Cl.
*G11C 7/10* (2006.01)

(52) U.S. Cl. .............. 365/189.05; 365/185.11; 365/185.04

(58) Field of Classification Search ........... 365/189.05, 365/185.11, 185.04
See application file for complete search history.

(56) References Cited

U.S. PATENT DOCUMENTS

| | | | |
|---|---|---|---|
| 5,673,222 A | 9/1997 | Fukumoto | 365/185.04 |
| 6,088,821 A | 7/2000 | Moriguchi et al. | 365/225.7 |
| 6,212,098 B1* | 4/2001 | Yachareni et al. | 365/185.04 |
| 6,215,717 B1 | 4/2001 | Takeguchi et al. | 365/230.03 |
| 6,829,181 B1* | 12/2004 | Seitoh | 365/201 |
| 2001/0003509 A1 | 6/2001 | Hosono et al. | 365/185.05 |
| 2003/0142571 A1 | 7/2003 | Kanda et al. | 365/225.7 |
| 2005/0276125 A1* | 12/2005 | Kido et al. | 365/189.05 |

FOREIGN PATENT DOCUMENTS

| | | |
|---|---|---|
| JP | 11-126489 A | 5/1999 |
| JP | 11-213680 A | 8/1999 |
| JP | 2001-176290 A | 6/2001 |

* cited by examiner

*Primary Examiner*—Huan Hoang

(57) ABSTRACT

The semiconductor device includes a memory cell array that includes memory cells for storing data and is managed on a sector basis, a memory that stores the information determining the activation status, a latch circuit that latches the activation information according to the information stored in the memory, and a circuit that latches the activation information according to the information stored in the memory in the latch circuit. The activation information according to the memory state of the memory is latched at the time of inputting a given command after activation, and it is thus possible to read the information stored in the memory and set the information in the latch circuit certainly.

23 Claims, 13 Drawing Sheets

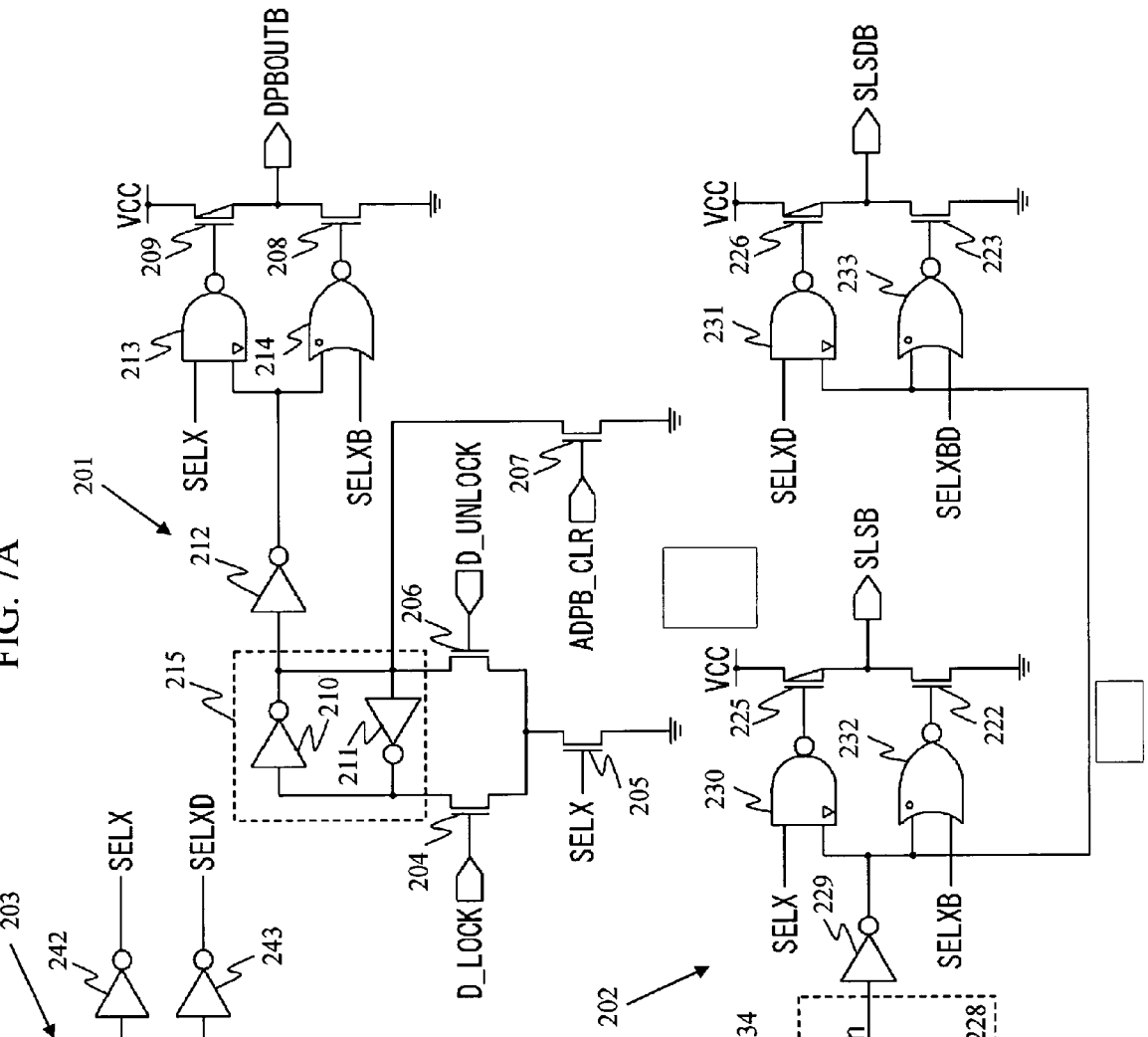
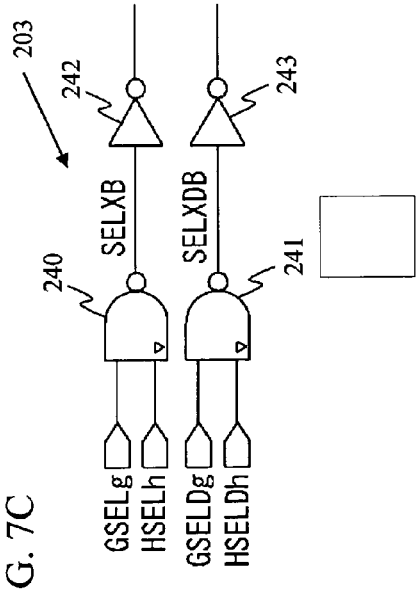
FIG. 7A
FIG. 7B
FIG. 7C

SEMICONDUCTOR DEVICE AND CONTROL METHOD OF THE SAME

CROSS REFERENCE TO RELATED APPLICATIONS

This is a continuation of International Application No. PCT/JP2004/006374, filed May 12, 2004.

BACKGROUND OF THE INVENTION

1. Field of the Invention

The present invention relates to semiconductor devices and control methods of the same, and more particularly, to a semiconductor device having an memory cell array in which memory cells for storing data are included and a control method of the semiconductor device.

2. Description of the Related Art

In recent years, a memory device or the like has increasingly had a protection mechanism to prevent the program from tampering. The protection methods are to include a content addressable memory (CAM) and to include a volatile bit (latch). The CAM is a non-volatile memory that stores whether or not the content is addressable. In either method, the protection can be performed by every block such as a sector.

If the protection is performed with the latch, all the protection information has to be set or reset in a latch circuit at the time of power on. Depending on the user, the latch should have a protection status in some cases, and the latch should not have the protection status in other cases. Therefore, the CAM is demanded to selectively change and satisfy the both cases in the circuit design.

Conventionally, the function has been selectively changed according to the CAM information as a general method. Setting or resetting the latch circuit should be performed only once after the power is on. Hence, it is not preferable that all the blocks be set or reset after the user has set the protection information of (protected) a certain block in the latch circuit. In a conventional circuitry, the information of the CAM is read and all the blocks are set or reset in the latch circuit with a signal that becomes activated after a power level is detected to have exceeded a certain level, for example, 2 V, at the time of power on.

With this method, however, the CAM has to be read to set or reset the latch circuit in an unstable condition that a power supply voltage is considerably lower than the normal operation. A sufficient level of voltage has to be supplied to a gate of a cell transistor to read the CAM. It is difficult to read the CAM correctly, unless the sufficient level of voltage is not supplied to the gate. Also, a power-on speed varies depending on the user, and there is a drawback in that it is difficult that the operation is performed certainly under every condition.

SUMMARY OF THE INVENTION

The present invention has an object of providing a semiconductor device and a control method of the semiconductor device so that the information stored in a given memory can be read and set in a latch circuit certainly.

According to an aspect of the present invention, preferably, there is provided a semiconductor device including: a memory storing information that determines an activated state; a latch circuit latches activation information based on the information stored in the memory; an activation control circuit causing the latch circuit to latch the activation information by referring to the memory when a given command is input after activation. It is thus possible to read the information stored in the memory and set the information in the latch circuit certainly.

On the above semiconductor device, the activation control circuit may cause the latch circuit to latch the activation information when the given command is first input. The activation information can be latched in the latch circuit certainly, when the power supply voltage is stable after the command input.

On the above semiconductor device, in a case where the activation control circuit causes the activation control circuit to latch the activation information when a power supply voltage is equal to or lower than a predetermined voltage, the activation control circuit causes the activation control circuit to latch the given command again when the given command is input again. It is thus possible to read the information stored in the memory and set the information in the latch circuit certainly.

On the above semiconductor device, in a case where the activation control circuit causes the activation control circuit to latch the activation information when a power supply voltage is higher than a given power supply voltage, the activation control circuit does not cause the activation control circuit to latch the given command even when the given command is input again. This can eliminate unnecessary operations.

On the above semiconductor device, when the memory is in a programmed state, the activation control circuit produces a given set signal that causes the activation information to be written into the latch circuit. On the above semiconductor device, when the memory is in an erased state, the activation control circuit may produce a reset signal that resets the latch circuit.

The semiconductor device may further include a memory cell array that includes memory cells for storing data and is managed on a sector basis, wherein the latch circuit latches the activation information on the sector basis. On the above semiconductor device, the latch circuit may latch a single piece of the activation information for multiple sectors. The given command may be a write command.

On the above semiconductor device, the information that is stored in the memory and determines the activated state may include information indicating whether each sector should be activated in a protected state or in an unprotected state. It is thus possible to determine whether each sector is powered on having the protection status or unprotection status.

On the above semiconductor device, the memory may be a content addressable memory. With the content addressable memory, the data corresponding to the externally input data can be searched in the memory and output, in addition to the storage function of the normal RAM (Random Access Memory) such as programming and reading the data.

The semiconductor device may further include an erase circuit that erases data in the memory cells in the memory cell array on the basis of the activation information latched in the latch circuit.

The semiconductor device may further include a control circuit that controls erasing by the erase circuit on the basis of the activation information latched in the latch circuit.

The semiconductor device may further include a second memory cell array having memory cells for storing sector protection information, wherein the control circuit determines whether the memory cell array should be erased on the basis of the activation information latched in the latch circuit and the sector protection information stored in the second memory cell array.

On the semiconductor device, the latch circuit may include: first circuits that latch the activation information on the sector basis; and a second circuit that is commonly provided to the first circuits and decodes an address. It is thus possible to reduce the number of the transistors. This can cut down the layout, and the chip area is cut down, too.

On the semiconductor device, the latch circuit may further include a third circuit that is commonly provided to the first circuits and outputs the activation information latched in the first circuits. It is thus possible to reduce the number of the transistors.

According to another aspect of the present invention, preferably, there is provided a semiconductor device including: a memory cell array that includes memory cells for storing data and is managed on a sector basis; a latch circuit including first circuits each latching information on a respective sector of the memory cell array, and a second circuit that is commonly provided to the first circuits and decodes an address; and a control circuit controlling sectors of the memory cell array on the basis of the information latched in the first circuits. It is thus possible to reduce the number of the transistors. This can cut down the layout, and the chip area can be cut down, too.

On the semiconductor device, the latch circuit may further include a third circuit that is commonly provided to the first circuits and outputs the information latched in the first circuits. It is thus possible to significantly reduce the number of the transistors.

According to another aspect of the present invention, preferably, there is provided a semiconductor device including: a memory cell array that includes memory cells for storing data and is managed on a sector basis; a latch circuit including first circuits each latching information on a respective sector of the memory cell array, and a third circuit that is commonly provided to the first circuits and outputs the information latched in the first circuits; and a control circuit controlling sectors of the memory cell array on the basis of the information latched in the first circuits. The output circuit is commonly provided to the multiple latch circuits, and it is thus possible to significantly reduce the number of the transistors. This can cut down the layout, and the chip area can be cut down, too.

On the semiconductor device, the second circuit may be commonly provided to the first circuits respectively corresponding to sectors in a given block. This can facilitate the design when cut own.

On the semiconductor device, the third circuit may be commonly provided to the first circuits respectively corresponding to sectors in a given block. This can facilitate the design when cut own. The information on the respective sector may be sector protection information. The information on the respective sector may be erase information.

According to another aspect of the present invention, preferably, there is provided a semiconductor device including: a memory cell array that includes memory cells for storing data and is managed on a sector basis; a first latch circuit including first circuits each latching information on a respective sector of the memory cell array, a second circuit that is commonly provided to the first circuits and decodes an address, and a third circuit that is commonly provided to the first circuits and outputs the information latched in the first circuits; and a second latch circuit including fourth circuits each storing erase information on a respective sector, a fifth circuit decoding an address provided commonly to the fourth circuits, and a sixth circuit that is commonly provided to the fourth circuits and outputs the information latched in the fourth circuit. It is thus possible to reduce the number of the transistors. This can cut down the layout, and the chip area can be cut down, too.

On the semiconductor device, the control circuit controls programming or erasing of a sector in the memory cell array on the basis of the information latched in the latch circuit. The semiconductor device may be a semiconductor memory device.

According to another aspect of the present invention, preferably, there is provided a method comprising the steps of: referring to a memory storing information that determines an activated state when a given command is input after activation;
causing activated information corresponding to the information stored in the memory to be latched in a latch circuit; and controlling a memory cell array having memory cells for storing data on the basis of the activated information latched in the latch circuit.

In accordance with the present invention, it is possible to provide a semiconductor device and a control method of the semiconductor device so that the information stored in a given memory can be read and set in a latch circuit certainly.

BRIEF DESCRIPTION OF THE DRAWINGS

FIG. 6A is a timing chart when a signal WEXB is High at the time of power-on, and FIG. 6B is a timing chart when a signal WEXB is Low at the time of power-on;
FIGS. 7A through 7C are views showing the latch circuit in a conventional semiconductor device.

DESCRIPTION OF THE PREFERRED EMBODIMENTS

A description will now be given, with reference to the accompanying drawings, of embodiments of the present invention.

First Embodiment

Figure 1:
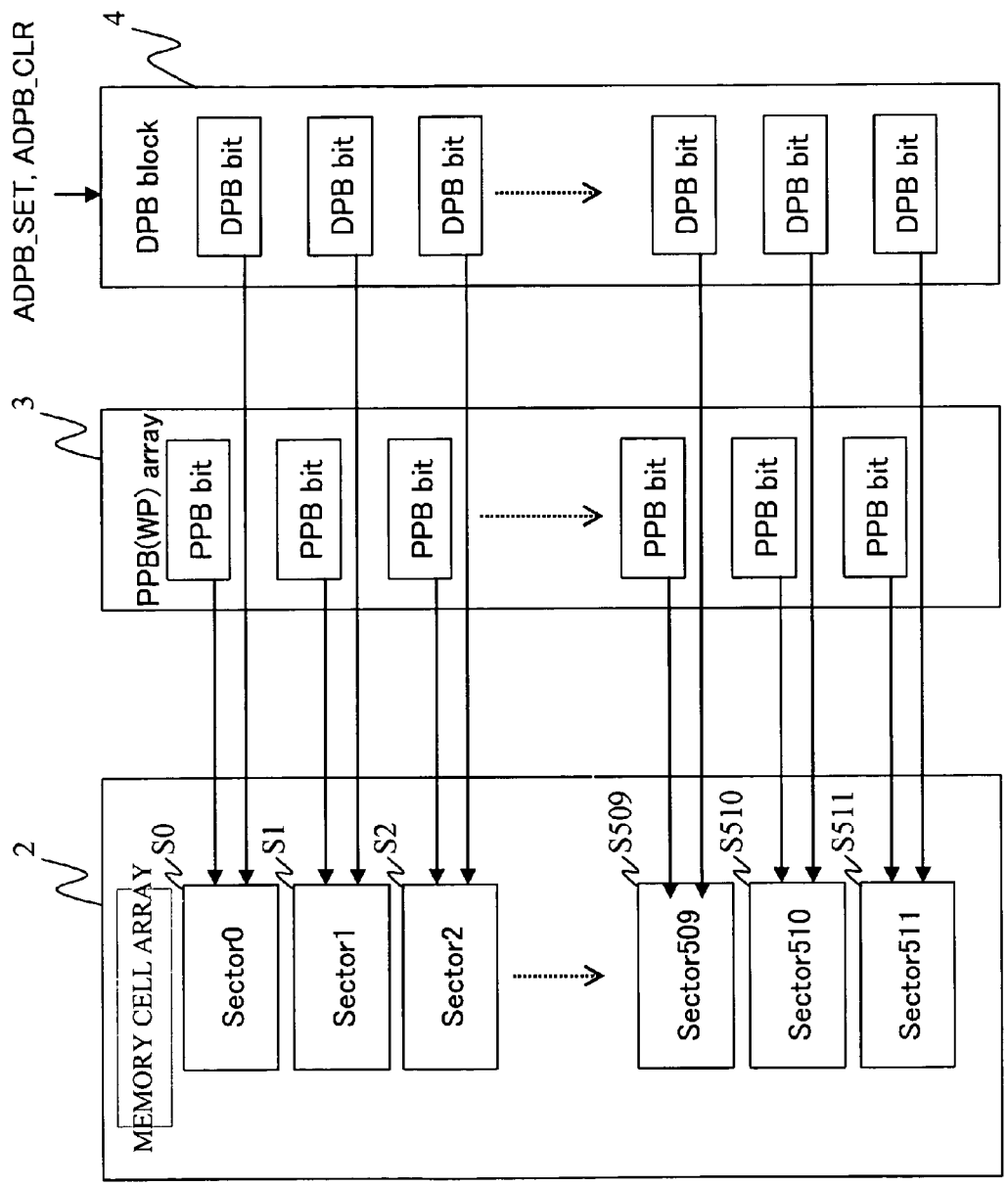
FIG. 1 is a schematic view of a sector protect.

A description will be given of a sector protect, first. FIG. 1 schematically shows the sector protect. As shown in FIG. 1, a semiconductor device 1 includes a memory cell array 2, a WP (PPB: Persistent Protection Bit) cell array 3, and a DPB (Dynamic Protection Bit) block 4. The semiconductor device 1 may be a semiconductor memory device such as a single packaged flash memory, or may be incorporated into the semiconductor device such as a system LSI. The semiconductor device 1 protects each sector with the protection information in which 1-bit protection information of the non-volatile WP cell array 3 is combined with 1-bit protection information of the volatile DPB block 4.

The memory cell array 2 is divided into sectors S0 through S511 and is managed by the sector. Here, an example of thus divided 512 sectors is shown. The WP cell array 3 retains the PPB bits respectively corresponding to the sectors S0 through S511. The PPB bits serve as the protection information. The WP cell array 3 is composed of a non-volatile memory cell same as the memory cell array 2.

The DPB block 4 retains the DPB bits respectively corresponding to the sectors S0 through S511. The DPB block 4 retains the protection information with the DPB bit. The DPB block 4 is composed of a logic circuit. The semiconductor device 1 determines the protection status of the sectors S0 through S511 with the respectively corresponding data of OR operation between the protection information of the WP cell array 3 and the protection information of the DPB block 4.

Figure 2:
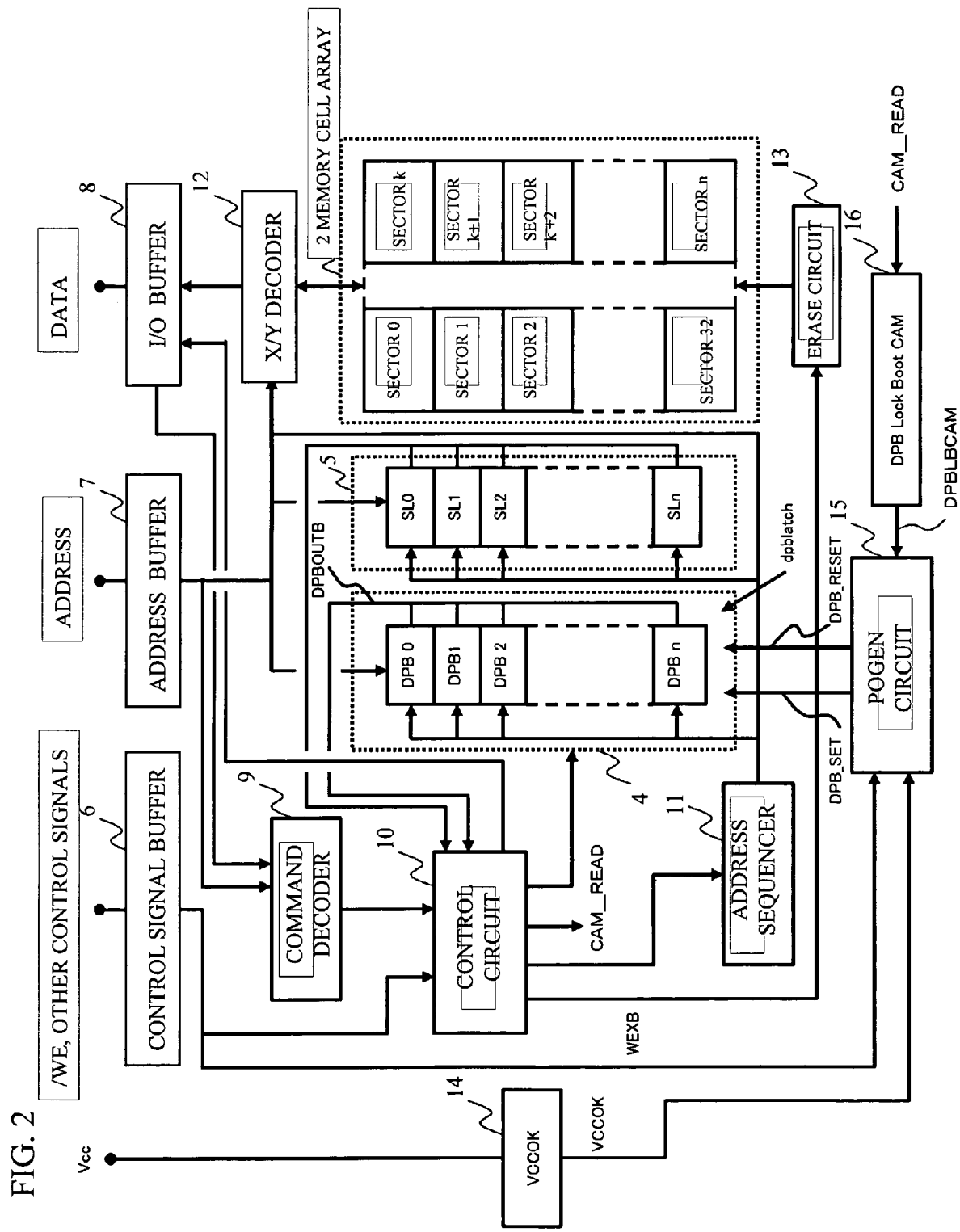
FIG. 2 is a block diagram of a semiconductor device in accordance with a first embodiment.

Next, a description will be given of the semiconductor device in accordance with the first embodiment specifically. FIG. 2 is a block diagram of the semiconductor device in accordance with the first embodiment. As shown in FIG. 1, the semiconductor device 1 includes the memory cell array 2, the DPB block 4, a sector latch block 5, a control signal buffer 6, an address buffer 7, an I/O buffer 8, a command decoder 9, a control circuit 10, an address sequencer 11, and x/Y decoder 12, an erase circuit 13, a VCCOK circuit 14, a POGEN circuit 15, and a CAM 16.

The DPB block 4 includes a latch circuit that latches activation information according to the information stored in the CAM 16. The CAM 16 is a non-volatile memory, for example, a flash memory cell, same as a cell in the memory cell array 2. The latch circuit is composed of a volatile memory. The latch circuit retains the protection information of the DPB bits corresponding to the respective sectors. The latch circuit may latch the activation information by the sector, or may latch a single piece of activation information with multiple sectors.

The sector latch block 5 latches an erase flag of each sector. The control signal buffer 6 retains a write enable signal WE from the outside and other control signals, and supplies these signals to the control circuit 10 and the POGEN circuit 15. The address buffer 7 retains an address input from the outside, and supplies this address signal to the command decoder 9. The I/O buffer 8 retains the data from the outside and the control circuit 10. The command decoder 9 supplies the decoded result to the control circuit 10.

The control circuit 10 serves as a state machine, and controls each part according to the decoded result output from the command decoder. The control circuit 10 determines whether or not the memory cell array 2 should be erased according to the activation information and the protection information of the WP cell array 3 to control erasing operation in the erase circuit 13. The activation information is latched in a latch circuit 141 in the DPB block 4. The protection information of the WP cell array 3 is shown in FIG. 1.

The X/Y decoder 12 decodes a supplied X address signal, and selects a non-volatile memory cell having a designated X address in the memory cell array 2, according to the decoded result. Moreover, the X/Y decoder 12 decodes a supplied Y address signal, and selects a non-volatile memory cell having a designated Y address in the memory cell array 2, according to the decoded result. At the time of programming or erasing operation, a bit line of the designated Y address is selectively connected to a sense amplifier for verification (not shown). At the time of reading operation, the bit line of the designated Y address is connected to a sense amplifier for reading (not shown).

The memory cell array 2 includes multiple memory cells, word lines, bit lines, and the like. The memory cell array 2 is managed by multiple sectors S. When the data is read, the data to be read from the memory cell selected by the memory cell array 2 is supplied to the sense amplifier for reading. The sense amplifier for reading determines whether the data to be read is 0 or 1. The determination result is output from the I/O buffer 8 as a read data.

When the data is programmed, a given programming voltage is supplied to the memory cell 2 so as to set the word line and the bit line of the memory cell array 2 at appropriate voltages according to the respective operations, under the control of the control circuit 10. Thus, a charge is injected into the memory cell. When the data is erased, the erase circuit 13 applies the voltage for erasing on all the memory sells in the sector selected by the erase signal output from the control circuit 10, and applies an erase stress to the memory cell in the memory cell array 2 to erases the data.

When the VCCOK circuit 14 detects that a power supply voltage Vcc reaches a given level, the VCCOK circuit 14 supplies a signal VCCOK to the POGEN circuit 15. The CAM 16 stores the information that determines an activation condition. The information that determines the activation condition is stored in the CAM 16. However, the activation condition is not limited in particular, but includes the information showing whether each sector is activated in the protection status or in the unprotection status at the time of activation.

After activation, when a write command is first input into the POGEN circuit 15, the activation information is latched in the latch circuit of the DPB block 4, according to a memory state of the CAM 16. The POGEN circuit 15 generates a signal SET_LATCHB. The activation information is latched in the latch circuit in the DPB block 4 if the power supply voltage VCC is equal to or lower than a given voltage in viewing the signal VCCOK from the VCCOK circuit 14. The POGEN circuit 15 latches the activation information in the latch circuit in the DPB block 4 again if the command is input next. It is thus possible to read the information stored in the memory and set in the latch circuit certainly.

The activation information is latched in the latch circuit in the DPB block 4 if the power supply voltage VCC is equal to or higher than a given voltage in viewing the signal VCCOK from the VCCOK circuit 14. The POGEN circuit 15 does not latch the activation information in the latch circuit in the DPB block 4 again if the command is input next. It is thus possible to eliminate unnecessary operations.

Figure 3:
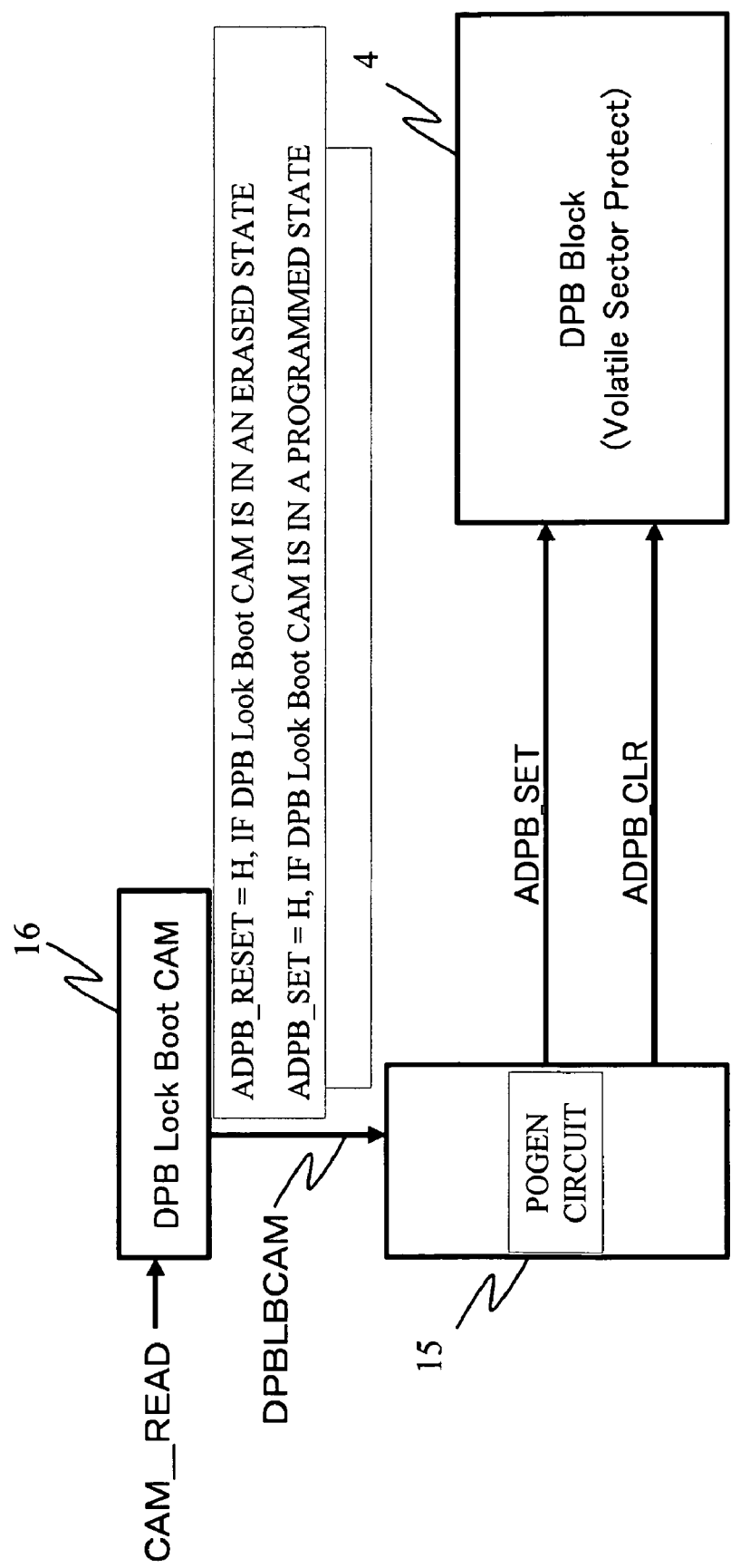
FIG. 3 is a view illustrating a POGEN circuit operation.

Next, a description will be given of the POGEN circuit. FIG. 3 shows the operation of the POGEN circuit. In FIG. 3, the reference numeral 4 indicates the DPB block, the reference numeral 15 indicates the POGEN circuit, and the reference numeral 16 indicates the CAM. When the CAM 16 is in an erased state, the POGEN circuit 15 sets a reset signal ADPB_CLR to High and resets the protection information of the latch circuit in the DPB block 4. On the other hand, when the CAM 16 is in a programmed state, the POGEN circuit 15 sets a set signal ADPB_SET to High and sets the protection information of the latch circuit in the DPB block 4.

Figure 4:
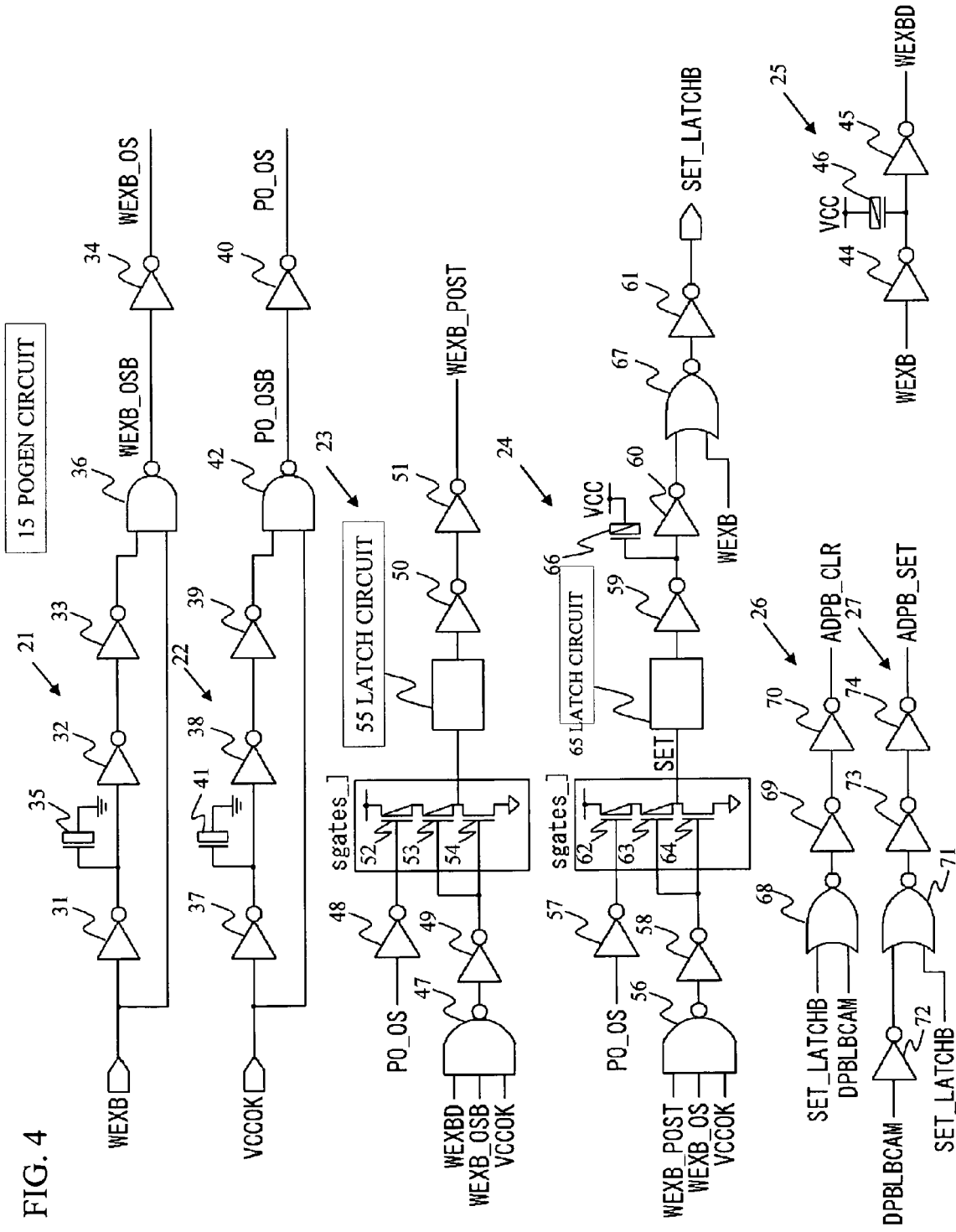
FIG. 4 is a view of the POGEN circuit.

Next, a description will be given of the POGEN circuit 15. FIG. 4 is a circuit diagram of the POGEN circuit 15. As shown in FIG. 4, the POGEN circuit 15 includes circuits 21 through circuits 27. The circuit 21 includes inverters 31 through 34, a capacitor 35, and a NAND circuit 36. In the circuit 21, an internal signal WEXB corresponding to the write enable signal /WE from the outside is input into the inverter 31 and the NAND circuit 36, and an output WEXB_OSB of the NAND circuit is inverted in the inverter 34 to output a signal WEXB_OS. The signal WEXB_OS is input into the NAND circuit 56 in the circuit 24.

The circuit 22 includes inverters 37 through 40, a capacitor 41, and a NAND circuit 42. In the circuit 22, the signal VCCOK is input into the inverter 37 and the NAND circuit 42, and an output PO_OSB of the NAND circuit 42 is inverted in the inverter 40 to output a signal PO_OS. The signal PO_OS is input into the inverter 48 in the circuit 23 and the inverter 57 in the circuit 24. The circuit 25 includes inverters 43 and 44, and a capacitor 45. In the circuit 25, the signal WEXB is input into the inverter 44 and is delayed by the capacitor 46, and a signal WEXBD is output from the inverter 45. The signal WEXBD is input into a NAND circuit 47 in the circuit 23.

The circuit 23 latches the state of WEXB of a command input control circuit at the time of power on, and includes a NAND circuit 47, inverters 48 through 51, transistors 52 through 54, and a latch circuit 55. When the signal VCCOK, which becomes High only when the power level reaches a given level, turns from Low to High, the signal PO_OS turns to High only for a certain period. The signal PO_OS is input into the inverter 48, a PMOS transistor 52 turns ON.

Here, if the signal WEXB is Low, the NAND circuit 47 outputs High and the inverter 49 outputs Low. The PMOS transistor 53 turns ON and the NMOS transistor 54 turns OFF. High is set at the latch circuit 55 and a WEXB_POST is Low. Then, the WEXB turns from Low to High for the first time, the WEXB_OS outputs a signal that becomes High only for a certain period. However, WEXBD keeps Low in this period due to the delay, and the WEXB_POST is low, but the WEXB_POST becomes High when the WEXBD becomes High.

In the same manner, if the signal WEXB is High, the NAND circuit 47 outputs Low and the inverter 49 outputs High. The PMOS transistor 53 is OFF and the NMOS transistor 54 is ON. Low is set in the latch circuit 55 and the WEXB_POST becomes High. The WEXB_POST keeps High while the power is on.

The circuit 24 outputs an enable signal (SET_LATCHB), which controls a set or reset operation of the data read from the CAM 16 in the latch circuit 141 in the DPB block 4. A latch circuit 65 in the circuit 24 latches a signal SET of Low, and forces the SET_LATCHB to be High. The latch circuit 65 thus disables the set operation in which the data read from the CAM 16 is set in the latch circuit 141 in the DPB block 4.

The circuit 24 operates same as the circuit 23. After the power is on, when the signal VCCOK turns from Low to High, the signal PO_OS is High only for a certain period. The signal PO_OS is input into the inverter 57, and a PMOS transistor 62 turns ON. Here, the WEXB_OS is Low regardless of High/Low of the WEXB. The NAND circuit 56 outputs High, a PMOS transistor 63 turns ON by way of the inverter 58, and High is set at the latch circuit 65.

If the power is on with the signal WEXB of Low, the WEXB_POST is Low. Even if the WEXB_OS generated when the WEXB turns from Low to High first is pulsed, Low is not set in the latch circuit 65. However, after this, when the WEXBD becomes High as described, the latch circuit 55 is set to Low and the WEXB_POST is set to High. Accordingly, the latch circuit 65 is set to Low by the pulse of the WEXB_OS that generates when the WEXB signal turns from Low to High next time the command is input. Then, the latch circuit 65 keeps Low while the power is on.

Additionally, if the power is on with the signal WEXB of High, the WEXB_POST is High. The latch circuit 65 is set to Low by the pulse of the WEXB_OS generated when the WEXB turns from Low to High. The latch circuit 65 keeps Low while the power is on. Then, an input of a NOR circuit 67 is High through the inverters 59 and 60. Hence, even if the signal WEXB is Low, the signal SET_LATCHB does not become Low.

The output from the inverter 60 and the signal WEXB are input into the NOR circuit 67. A signal SET_LATCHB output from an inverter 61 is input into a NOR circuit 68 in the circuit 26 and a NOR circuit 71 in the circuit 27. The circuit 26 includes a NOR circuit 68, inverters 69 and 70. Signals of SET_LATCHB and BPBLBCAM are input into the NOR circuit 68, and a signal ADPB_CLR is output from the inverter 70. If the signal ADPB_CLR is High, the protection information of the latch circuit 141 in the DPB block 4 is cleared.

The circuit 27 includes the NOR circuit 71 and inverters 72 through 74. A signal DPBLBCAM is inverted by the inverter 72. The inverted signal and the signal SET_LATCHB are input into the NOR circuit 71. A signal ADPB_SET is output from the inverter 74. If the signal ADPB_SET is High, the protection information is set in the latch circuit 141 in the DPB block 4. The POGEN circuit 15 is capable of reading the protection information stored in the CAM 16 and setting the protection information in the latch in the DPB block 4 certainly.

Figure 5:
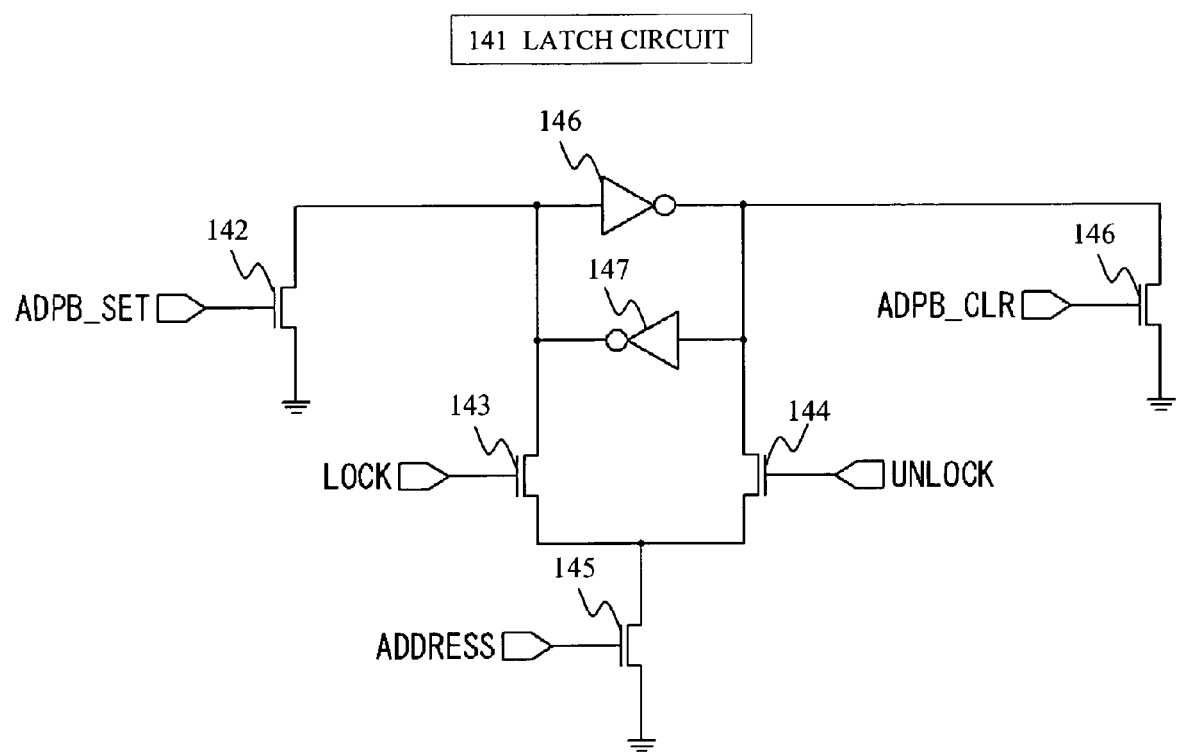
FIG. 5 is a view showing a latch circuit.

Next, a description will be given of the latch circuit in the DPB block circuit 4. FIG. 5 shows the latch circuit 141. The latch circuit 141 is provided equal in number to the sector in the DPB block 4. The latch circuit 141 retains the information showing whether or not the sector is protected from rewriting.

As shown in FIG. 5, the latch circuit 141 includes NMOS transistors 142 through 145 and inverters 146 and 147. Arbitrary latch circuit 141 is selected by controlling a gate of the transistor 145 with an address select signal ADDRESS output from the address sequencer 11. That is to say, the number of ADDRESS signal lines is provided to be equal to that of the latch circuits 141. Signals LOCK and UNLOCK are common signals to all the latch circuits 141, and the signals set lock (sector protect) and unlock (sector unprotect). If the signal ADPB_SET is High, the protection information is set in the latch made of the inverters 146 and 147. If the signal ADPB_CLR is High, the protection information of the latch made of the inverters 146 and 147 is reset.

Figure 6A:
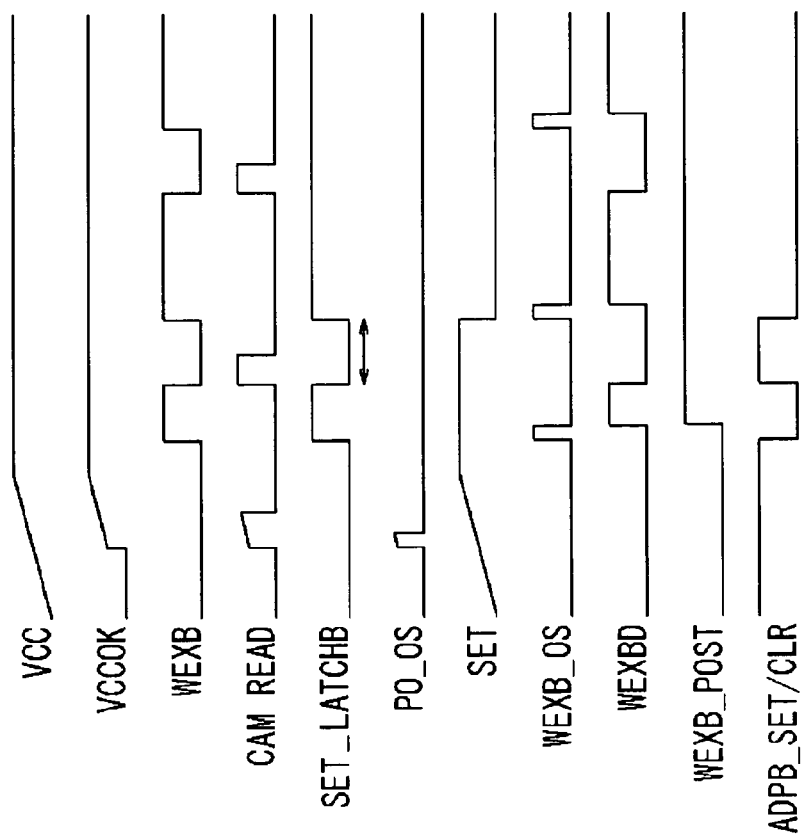
Figure 6B:
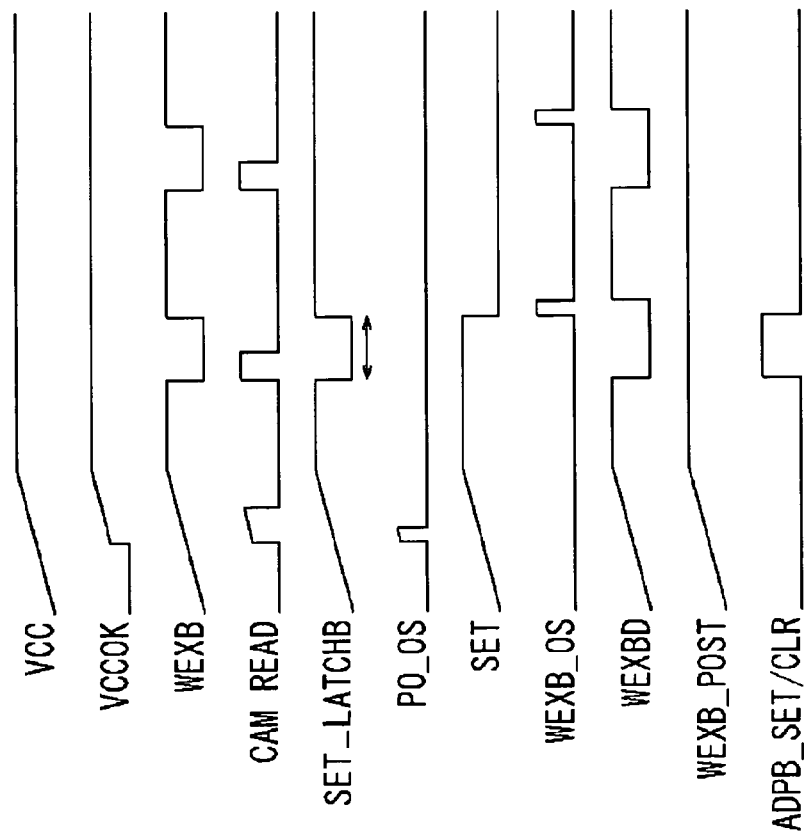

Next, a description will be given of the operation. FIG. 6A is a timing chart when the signal WEXB is High at the time of power on. FIG. 6B is a timing chart when the signal WEXB is Low at the time of power on. If the signal VCCOK operates at 3 V, for example, in the semiconductor device, the signal VCCOK becomes High after the power VCC is detected to be approximately 2.4 V.

Conventionally, the latch circuit of the DPB block 4 has been set and reset with the signal VCCOK at the time of power on. The semiconductor device operating at 3 V guarantees the operation ranging from 2.7 V to 3.6 V of the power VCC. Therefore, the aforementioned 2.4 V is out of range in use. When the power supply voltage VCC is low, an unstable operation is caused by setting and resetting the multiple latch circuits 141 at a time. For example, 512 latch circuits 141 have to be set and reset at a time if the power VCC is low in the memory cell array having 512 sectors therein. In accordance with the present embodiment, the setting and resetting are not to be performed at the level of the signal VCCOK as seen in the conventional method due to the above-mentioned problem.

The user has to issue a protect command to the semiconductor memory device 1 to set the protection information in the latch circuit 141. All the latch circuits 141 are set or reset with the first write command at the time of issuing the protect command. Or after the power is on, when the first program or erase command is input, all the latch circuits 141 are set or reset in the DPB block 4. At the time of issuing the command, the power level falls within an allowable range for the normal operation. It is thus possible to read the information of the CAM 16 and set the information in the latch circuit 141 certainly.

As shown in FIG. 6A, if the internal signal WEXB corresponding to the write enable signal /WE is activated at High, the power VCC starts to activate slowly and the signal VCCOK becomes high when the power reaches a certain level. The signal WEXB is an internal signal and is gradually activated in the same gradient as that of the power VCC. The signal WEXB turns from High to Low for the first time, according to the first command input. A signal CAM_READ outputs a High pulse for a certain period to read the CAM 16, when the signal VCCOK turns from Low to High or the signal WEXB turns from High to Low. The POGEN circuit 15 reads the information that determines the activation condition stored in the CAM 16 with the second CAM_READ. At this time, the signal SET_LATCHB is Low, and the information can be stored in the latch circuit 141 regarding whether the power VCC is activated in a protected state or an unprotected state.

If the CAM 16 has the programmed state, the signal DPBLBCAM is High. If the CAM 16 has the erased state, the signal DPBLBCAM is Low. While the signal WEXB is Low, a signal SETLATCHB turns from High to Low. In the circuit 26 as shown in FIG. 4, the signal SET_LATCHB is Low and the signal DPBLBCAM is Low, the NOR circuit 68 outputs High and the inverter 70 outputs the signal ADPB_CLR of High. The protection information of all the latch circuits 141 in the DPB block 4 is reset, and is activated in the unprotected state.

On the other hand, if the signal SET_LATCHB is Low and the signal DPBLBCAM is High in the circuit 27 in FIG. 4, the output of the NOR circuit 73 is High and the inverter 74 outputs the signal ADPB_SET of High. The protection information is thus set in all the latch circuits 141 in the DPB block 4, and is activated in the protected state.

After the CAM information is set or reset in the latch circuit 141, the signal SET turns from High to Low while the signal WEXB is turns from Low to High. Here, the signal SET_LATCHB is High and the signal SET is Low. Next, when the signal WEXB turns from High to Low, the signal SET_LATCHB does not turn to Low. This is because the latch circuit 65 keeps latching the signal SET of Low. Therefore, once the protection information is set and reset in the latch circuit 141, the latch circuit 65 in the circuit 24 shown in FIG. 4 is inverted and signals for set and reset are not generated at the time of issuing the next command.

As shown in FIG. 6B, if the signal WEXB is activated at Low, the power VCC is slowly activated and the signal VCCOK turns to High when the power reaches a certain level. The signal WEXB has to be operated from High in order to program the command. Therefore, the user supplies a driver to set the signal WEXB to High once. The POGEN circuit 15, after the signal VCCOK becomes High, reads the CAM 16 in an unstable state that the power supply voltage VCC is being activated because the signal WEXB is Low and the signal SET_LATCHB is Low while the signal CAM_READ is High. Then, the POGEN circuit 15 sets or resets the protection information in the latch circuit 141 in the DPB block 4. Therefore, the protection information is set again in the latch circuit 141 in the DPB block 4, when the signal WEXB turns from High to Low next time.

Specifically, if the signal SET_LATCHB is Low and the signal DPBLBCAM is Low in the circuit 26 in FIG. 4, the NOR circuit 68 outputs High and the inverter 70 outputs the signal ADPB_CLR of High. The protection information is thus reset in all the latch circuits 141 in the DPB block 4, and is activated in the unprotected state.

Also, if the signal SET_LATCHB is Low and the signal DPBLBCAM is High in the circuit 27 in FIG. 4, the NOR circuit 73 is outputs High and the inverter 74 outputs the signal ADPB_SET of High. The protection information is thus set in all the latch circuits 141 in the DPB block 4, and is activated in the protected state.

After the CAM information is set or reset in the latch circuit 141, the signal SET turns from High to Low while the WEXB is being activated from Low to High. If the signal SET_LATCHB is High, the signal SET becomes Low. When the signal WEXB turns from High to Low next time, the signal SETLATCHB does not become Low. Therefore, once the protection information is set and reset in the latch circuit 141, the latch circuit 65 in the circuit 24 shown in FIG. 4 is inverted, and the set or reset signal is not generated when the next command is issued. In the above-mentioned embodiment, the protection information has been mentioned as an example; however, the information to be read from the CAM 16 at the time of power on often determines various operation modes of the device. The present embodiment is applicable to those cases.

The first embodiment is summarized as follows. The semiconductor device includes the memory cell array 2 that includes memory cells for storing data and is managed on a sector basis, the CAM (memory) 16 for storing information that determines the activation state, the latch circuit 4 for latching the activated information according to the information stored in the CAM 16, and the POGEN circuit (activation control circuit) 15 for latching the activation information in the latch circuit 4 referring to the CAM 16 at the time of inputting a given command. In accordance with the first embodiment, the activation information is latched in the latch circuit 141 in the DPB block 4 according to the memory state of the CAM 16 when the given command is input after activation. It is thus possible to read the information stored in the CAM 16 and set the information in the latch circuit 141 certainly.

Second Embodiment

Next, a description will be given of a second embodiment. FIG. 7 shows a latch circuit of a conventional semiconductor device. FIG. 7A is a circuit 201 that latches the protection information of the sector array. FIG. 7B is a circuit 202 that latches the erase information. FIG. 7C is a signal conversion circuit 203. As shown in FIG. 7A, the circuit 201 latches the protection information of the sector array, and includes NMOS transistors 204 through 208, a PMOS transistor 209, inverters 210 through 212, a NAND circuit 213, and a NOR circuit 214. The circuit 201 is provided to every sector. If there are 512 sectors, 512 circuits 201 are required.

As shown in FIG. 7B, the circuit 202 includes NMOS transistors 220 through 223, PMOS transistors 224 through 226, inverters 227 through 229, NAND circuits 230 and 231, NOR circuits 232 and 233. The circuit 202 latches the erase information of the sector to be erased, when the user inputs a command. The circuit 202 is provided to every sector. That is to say, if there are 512 sectors, 512 circuits 202 are required. In a layout of the sector, as an example in FIG. 8, there are provided 32 vertical blocks in the horizontal direction, the vertical block being composed of 32 sectors arranged in the vertical direction. Also, there are provided 32 horizontal blocks in the vertical direction, the horizontal block being composed of 16 sectors arranged in the horizontal direction.

As shown in FIG. 7C, the circuit 203 includes NAND circuits 240 and 241 and inverters 242 and 243. A signal GSELg is an internal sector decode signal that selects one of the 16 vertical blocks, each of which is composed of 32 sectors. A signal HSELh is a signal that selects 32 horizontal blocks, that is, an internal sector decode signal that selects one of the 32 sectors in the vertical block. A signal GSELDg is an external sector decode signal that selects the vertical block. A signal HSELDh is an external sector decode signal that selects the horizontal block.

The NAND circuit 240 performs the NAND operation of the signal GSELg and the signal HSELh, the inverter 242 inverts an input signal SELXB to output a signal SELX. The signal SELX is unique to each sector. That is to say, the signal SELX is provided equal in number to the sector. When a sector is selected, the signal SELX to the sector becomes High. The signal SELX is input into a NMOS transistor 205 and a NAND circuit 213 in the circuit 201, and is input into a NMOS transistor 220 and a NAND circuit 230 in the circuit 202. The signal SELXB in the NAND circuit 240 is input into the NOR circuit 214 in the circuit 201 and the NOR circuit 232 in the circuit 202.

The NAND circuit 241 performs the NAND operation of the externally input signal GSELDg and the signal HSELDh, the inverter 243 inverts an input signal SELXDB to output a signal SELXD. The signal SELXD is input into the NAND circuit 231 in the circuit 202. The signal SELXDB is input into the NOR circuit 233 in the circuit 202.

The circuit 201 includes a latch circuit 215 composed of the inverters 210 and 211. The inverters 210 and 211 are reversely connected in parallel. The gate of the NMOS transistor 204 is controlled by a signal D_LOCK. The signal D_LOCK is used for setting a sector protect bit. The gate of the NMOS transistor 206 is controlled by a signal D_UN-LOCK. The signal D_UNLOCK is used for clearing the sector protect bit. The gate of the NMOS transistor 205 is controlled by a signal SELX. The gate of the NMOS transistor 207 is controlled by a signal ADPB_CLR.

The signal ADPB_CLR becomes High after the power on, and resets the latch of the DPB block. If the signal SELX is High and the output of the inverter 212 is High, the output of the NAND circuit 213 is Low and the PMOS transistor 209 is ON. If the signal SELXB is Low and the output of the inverter 212 is HIGH, the output of the NOR circuit 214 is Low, the NMOS transistor 208 is OFF, and the output data DPBOUTB is output at High.

If the protection information is latched in the latch 215, the output of the inverter 212 is Low, the NMOS transistor 208 is ON, and the DPBOUTB is Low. When the signal DPBOUTB is Low, the sector is protected. If the signal SELX is Low, the PMOS transistor 209 and the NMOS transistor 208 are OFF. The state of the DPBOUT is decided by the circuit that latches the protection information of another sector in which the signal SELX is High.

In the circuit 202, the PMOS transistor 224 and the NMOS transistors 220 and 221 are connected in series between the power VCC and the ground GND. The gate of the PMOS transistor 224 is controlled by a signal SLRSTB, the gate of the NMOS transistor 220 is controlled by a signal SLEN, and the gate of the NMOS transistor 221 is controlled by the signal SELX. The signal SLEN is used for latching the sector information to be erased at the time of inputting the sector erase command.

A connection node of the PMOS transistor 224 and the NMOS transistor 220 is connected to a latch circuit 234, which includes the inverters 227 and 228 reversely connected in parallel. The latch circuit 234 latches the erase information. The signal SLRSTB is used for resetting the erase sector latch. The SLRSTB is Low before erasing the sector, and the latch is reset. The output of the latch circuit 234 is inverted and is output through the inverter 229. If the signal SELX is High and the output from the inverter 229 is High, the output of the NAND circuit 230 is Low and the PMOS transistor 225 is ON.

Here, the output of the NOR circuit 232 is Low, the NMOS transistor 222 is OFF, and High is output as an output data SLSB (Sector Latch Set Bar). The internal address hits the sector to be erased in this manner, and the SLSB becomes Low and the sector is erased. In the same manner, if the signal SELXD is High and the output of the inverter 229 is High, the output of the NAND circuit 231 is Low and the PMOS transistor 226 is ON.

Here, the output of the NOR circuit 233 is Low, the NMOS transistor is OFF, and High is output as an output data SLSDB (Sector Latch Set for Data Polling Bar). If the user selects the sector to be erased while the sector is being erased, the SLSDB is Low and an output bit is toggled. If the signal SELX is Low, the PMOS transistors 225 and 226 and the NMOS transistors 222 and 223 are OFF. The SLSB and SLSDB are decided by the circuit that latches the erase information of another sector in which the SELX is High.

Figure 8:
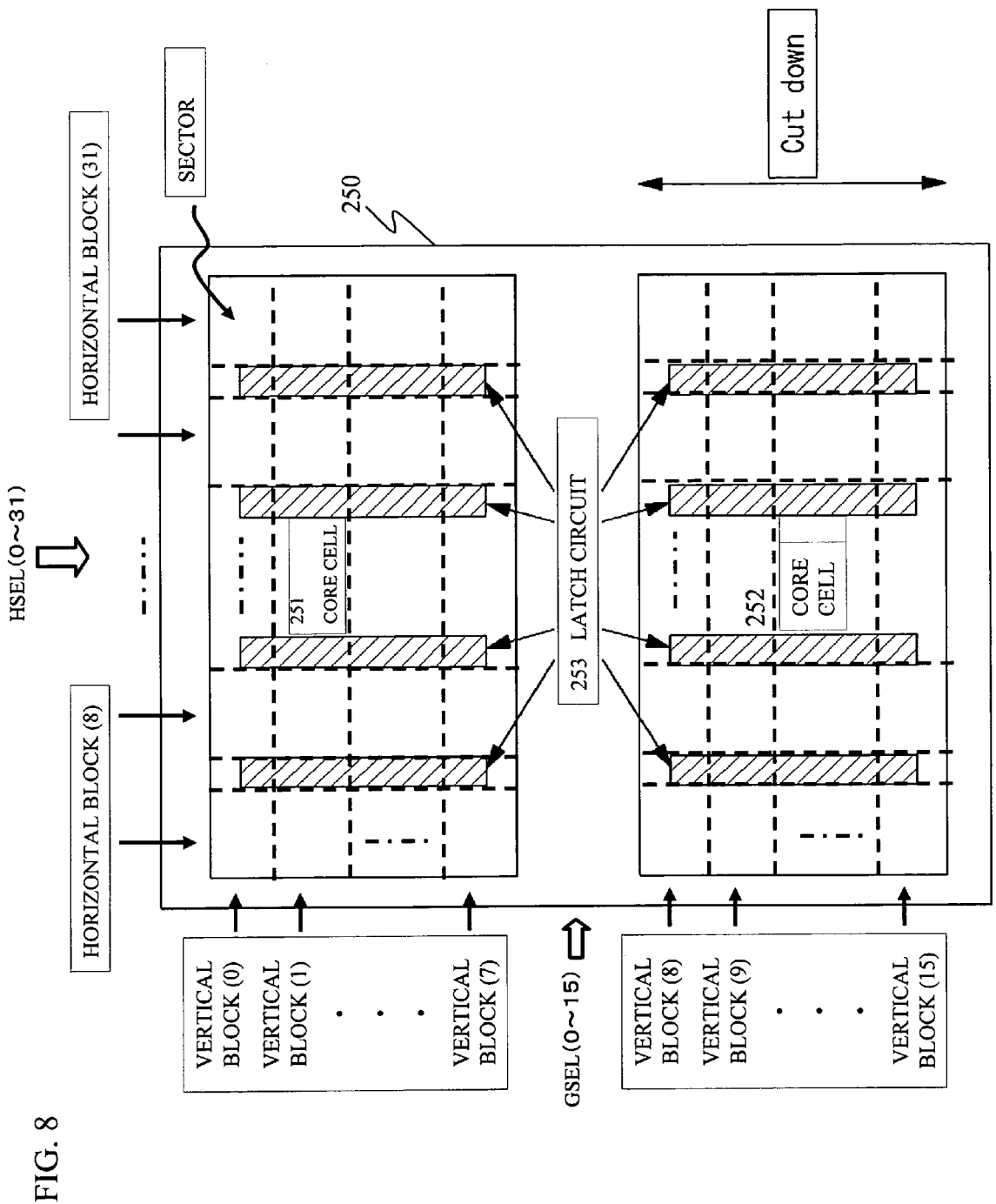
FIG. 8 is a view showing a layout of the latch circuit in the conventional semiconductor device.

FIG. 8 shows a layout of the latch circuit of the conventional semiconductor device. In FIG. 8, a reference numeral 250 indicates a whole chip. Reference numerals 251 and 252 indicate core cells. The reference numeral 253 indicates the latch circuit shown in FIG. 7. In an example in FIG. 8, the latch circuit 253 is arranged next to the sector array in the layout. This product type has an advantage in that an unnecessary sector array can be eliminated when 512 M is cut down to 256 M. However, there is a problem in that the circuit size is large and the layout area is increased. This is because the latch circuit 253 is arranged in a distributed manner and the output circuit becomes large, and the layout also becomes large.

It is to be noted that some semiconductor devices have two modes of erase mode and protect mode. Accordingly, the latch circuits are respectively provided to the two modes of the erase mode and the protect mode. If the flash memory includes 512 sectors, 1024 latch circuits are required and the output circuits are respectively required. There is a problem in that the number of the transistors grows and the layout becomes large.

The second embodiment has been made in view of the above-mentioned circumstances and has an object of providing the semiconductor device in which the memory size is efficiently cut down and the layout area does not become large.

Figure 9:
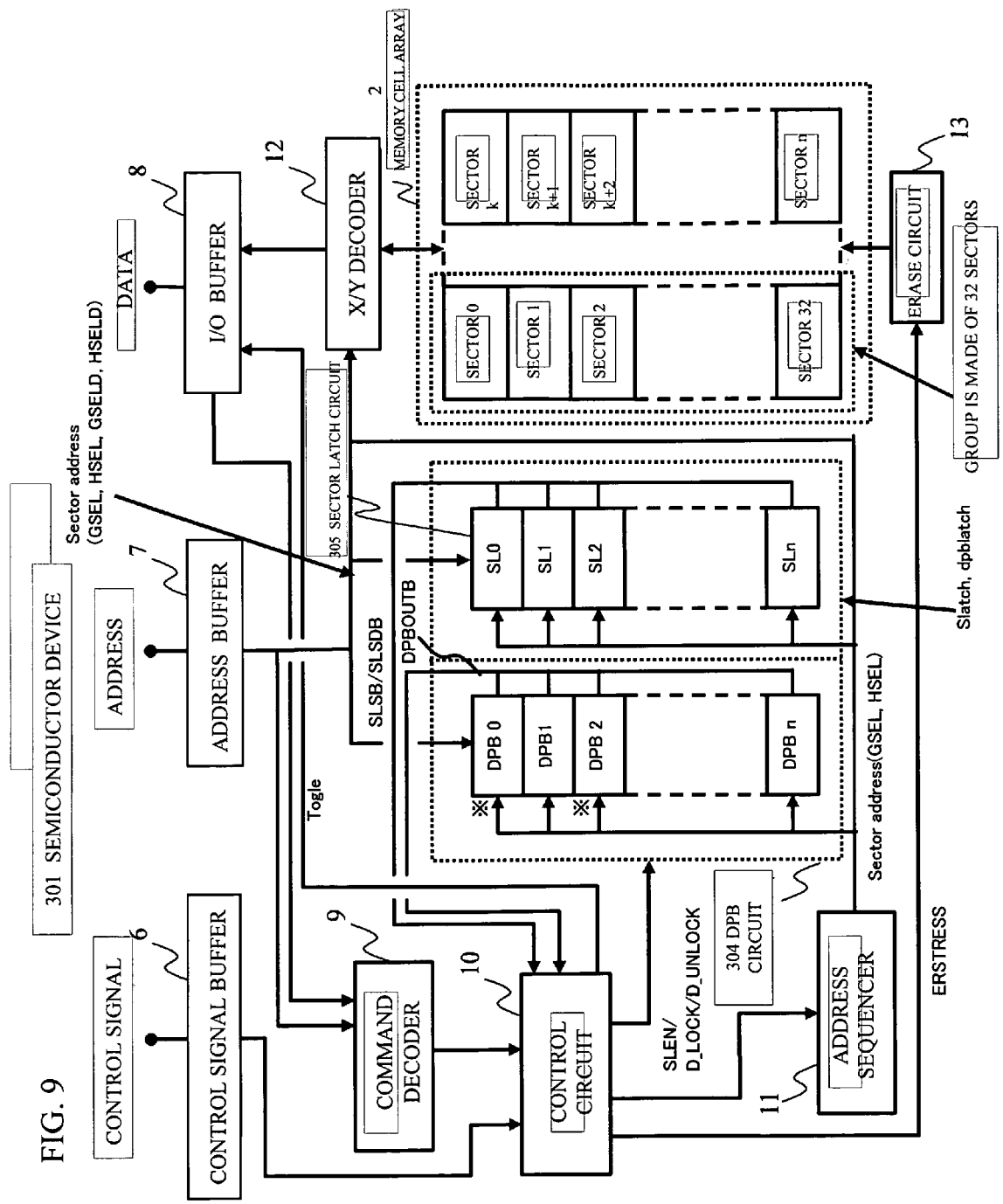
FIG. 9 is a block circuit showing erasing in the semiconductor device in accordance with a second embodiment.

FIG. 9 is a block diagram showing erase of the semiconductor device in the second embodiment. A semiconductor device 301 includes the memory cell array 2, a DPB circuit 304, a sector latch circuit 305, the control signal buffer 6, the address buffer 7, the I/O buffer 8, the command decoder 9, a control circuit 310, the address sequencer 11, and the X/Y decoder 12, and the erase circuit 13. The same components and configurations as described above have the same reference numerals and a detailed explanation will be omitted.

The memory cell array 2 is managed by the sector including the memory cells for storing data. The control signal buffer 6 retains the control signal from the outside, and supplies the control signal to the control circuit 10. The address buffer 7 retains the address signal from the outside, and supplies the address signal to the command decoder 9. The I/O buffer 8 retains the data from the outside and the data from the control circuit 10. The command decoder 9 decodes the input and supplies to the decoded result to the control circuit 10.

The control circuit 10 serves as a state machine and controls each sector according to the protection information and the erase information that are latched in the DPB circuit 304 and the sector latch circuit 305. The control circuit 10 supplies the signal SLEN to the sector latch circuit 305 so as to latch the sector information at the time of inputting a given command. The control circuit 10 supplies the signal D_LOCK that sets the sector protect bit and the D_UN-LOCK that clears the sector protect bit to the DPB circuit 304.

The address sequencer 11 selects the cell according to the signal output from the control circuit 10. The address sequencer 11 inputs the sector address signals GSELg and HSELh into the DPB circuit 304 and the sector latch circuit 305. The sector address signal GSELg selects a group composed of 32 sectors and the sector address signal HSELh selects one of the 32 sectors. The sector address signal GSELDg and the sector address signal HSELDh are input into the sector latch circuit 305 from the outside.

The protection information for rewriting the sector is set in the DPB circuit 304. The DPB circuit 304 outputs the signal DPBOUTB to the control circuit 10. When the signal DPBOUTB is Low, the sector is protected. The erase information for each sector is set in the sector latch circuit 305. If the internal address hits the sector to be erased, the sector latch circuit 305 outputs the signal SLSB of Low to the control circuit 10.

If the signal SLSB is Low, the control circuit 10 supplies an erase signal ERSTRESS to the erase circuit 13. The erase circuit 13 applies the voltage for erase on all the memory cells in the sector selected according to the erase signal ERSTRESS, and applies the erase stress on the memory cell to erase the data. If the user selects a sector to be erased while the sector is being erased, the signal SLSDB of Low is output to the control circuit 10.

When the control circuit 10 receives the signal SLSDB of Low, the control circuit 10 outputs a Toggle data (repeated data of H and L) to outside the chip through the I/O buffer 8. In FIG. 9, the PPB cell array is omitted. The control circuit 10 may control the erase circuit 13 according to the protection information into which pieces of the sector protection information of the PPB cell array and the DPB circuit 304 are combined.

Figure 10:
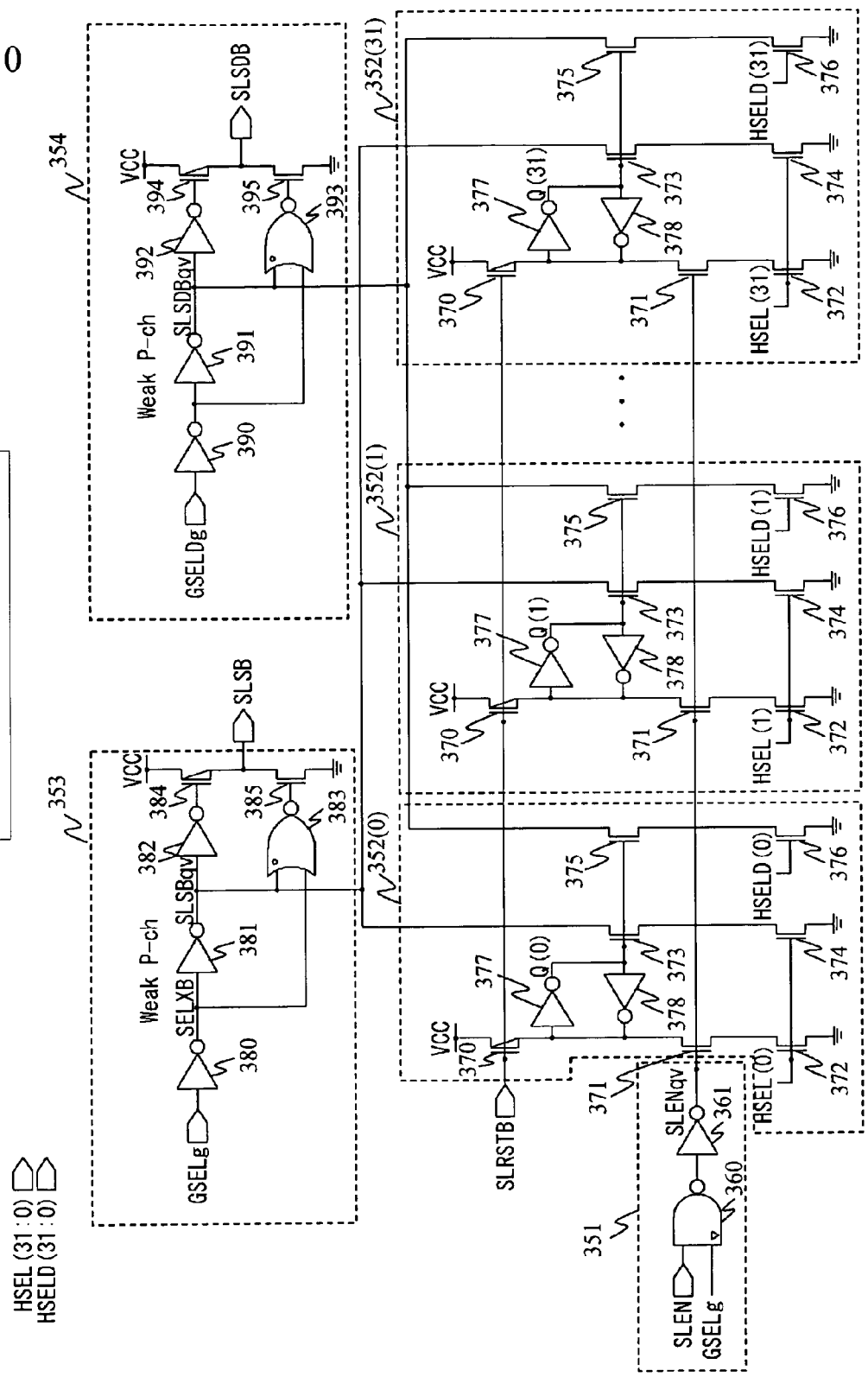
FIG. 10 is a view showing a sector latch circuit in accordance with the second embodiment.

Next, a description will be given of the sector latch circuit 305. FIG. 10 is a view illustrating the sector latch circuit in accordance with the second embodiment. As shown in FIG. 10, the sector latch circuit 305 includes a decode circuit 351, multiple latch circuits 352(0) through 352(31), and output circuits 353 and 354. The multiple latch circuits 352(0) through 352(31) respectively latch the information of the respective sectors. In the sector latch circuit 305, the output circuits 353 and 354 are commonly provided to the multiple latch circuits 352(0) through 352(31) in a vertical block. It is thus possible to reduce the number of the transistors. However, the latch circuits cannot be shared, and 32 latch circuits 352(0) through 352(31) are provided.

The decode circuit 351 decodes the address commonly provided to the multiple latch circuits 352(0) through 352(31), and includes a NAND circuit 360 and an inverter 361. The latch circuits 352(0) through 352(31) respectively include a PMOS transistor 370, NMOS transistors 371 through 376, and inverters 377 and 378.

The output circuit 353 includes inverters 380 through 382, a NOR circuit 383, a PMOS transistor 384, and a NMOS transistor 385. The output circuit 354 includes inverters 390 through 392, a NOR circuit 393, a PMOS transistor 394, and a NMOS transistor 395. The output circuits 353 and 354 are commonly provided to the multiple latch circuits 352(0) through 352(31), and output the information latched in the respective circuits 352(0) through 352(31).

In the sector latch circuit 305, the PMOS transistor 370 and the NMOS transistors 371 and 372 are connected in series between the power VCC and the ground. The latch composed of the inverters 377 and 378 is connected between the PMOS transistor 370 and the NMOS transistor 371. The gate of the PMOS transistor 370 is controlled by the signal SLRSTB that resets the erase sector latch.

NMOS transistors 373 and 374 are connected in series between the output of the inverter 381 and the ground. NMOS transistors 375 and 376 are connected between the output of the inverter 391 and the ground.

In the decode circuit 351, the signal SLEN is input to latch the sector information to be erased at the time of inputting the sector erase command. The internal sector decode signal GSELg is input to select the vertical block composed of 32 sectors. The NAND circuit 360 performs a NAND operation of the input signal SLEN and the signal GSELg. The inverter 361 inverts the input signal and outputs an inverted signal SLENqv.

The gate of the NMOS transistor 371 is controlled by the output SLENqv from the decode circuit 351, and the sector information to be erased is latched at the latch. The signal SLRSTB is Low before erasing the sector, the output SLENqv from the inverter 361 is High, and the latch is reset.

The gates of the NMOS transistors 373 and 375 are controlled according to the data in the latch composed of the inverters 377 and 378. The gates of the NMOS transistors 372 and 374 are controlled by internal sector decode signals HSEL(0) through HSEL(31) that select one of the 32 sectors. The gate of the NMOS transistor 376 is controlled by external sector decode signals HSELD(0) through HSELD(31).

In the output circuit 353, the internal sector decode signal GSELg, which selects the vertical block composed of 32 sectors, is input into the inverter 380. For example, a zeroth sector is to be erased in one vertical block, the HSEL(0) is High and Q(0) is set to High. If the signal GSELg is High, High is output by the inverter (with weak Pch) 381 that receives the signal GSELg. However, the signal HSEL(0) is High and Q(0) is High, and the signal SLSBqv is strongly pulled down to the ground to become Low. This circuit operation can be realized by making the driving capabilities of the NMOS transistors 373 and 374 weaker than that of the PMOS transistor of the inverter 381. If the signal SLSBqv is Low, the NMOS transistor 385 turns ON and the signal SLSB is Low. Thus, the sector is erased. In the conventional circuit shown in FIG. 7B, the decode signals for the 32 sectors are respectively provided for the output circuits (the transistors 225 and 222). The output circuit 353 is configured so that a common output line (output from the transistor 373) is input from the latch circuits 352(0) through 352(31) for the 32 sectors.

In the output circuit 354, the external sector decode signal GSELDg, which selects the vertical block composed of 32 sectors, is input into the inverter 390. If the signal GSELDg is High, the inverter (with weak Pch) 391 that receives the signal GSELDg outputs High. If the user selects the zeroth sector in the vertical block from the outside while the erase is being performed, the signal HSELD(0) becomes High, Q(0) is High, and the signal SLSDBqv is strongly pulled down to the ground to become Low. When the signal SLSDBqv is Low, the NMOS transistor 395 is ON and the signal SLSDB is Low. Thus, the output bit is toggled. In this manner, the decode circuit 351 and the output circuits 353 and 354 are commonly provided to the latch circuits 352(0) through 352(31) corresponding to the sectors included in a given vertical block.

Figure 11:
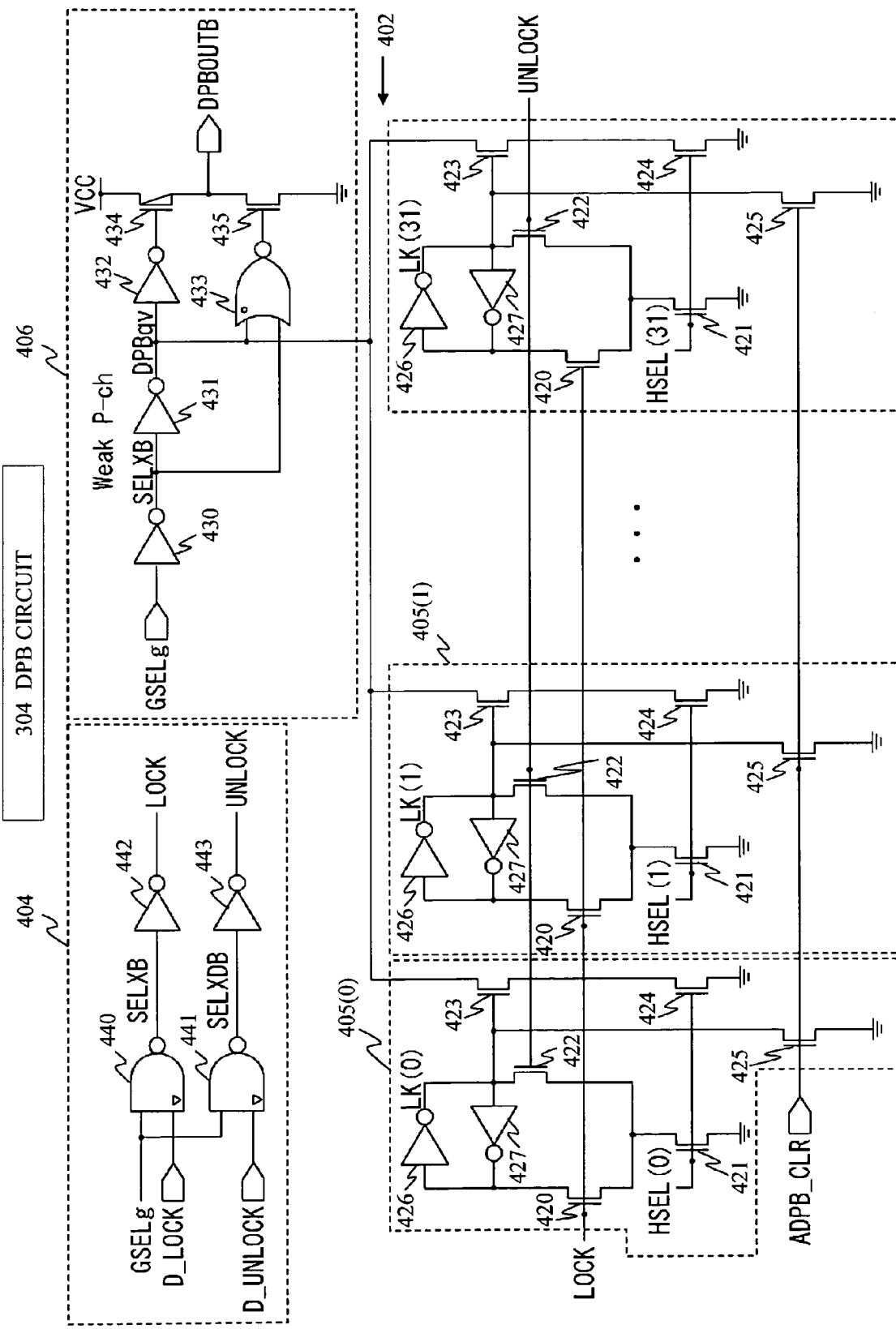
FIG. 11 is a view showing a DPB circuit in accordance with the present embodiment.

Next, a description will be given of the DPB circuit 304. FIG. 11 shows the DPB circuit 304 in accordance with the present embodiment. As shown in FIG. 11, the DPB circuit 304 includes a decode circuit 404, latch circuits 405(0) through 405(31), and an output circuit 406. The output circuit 406 is commonly provided to multiple latch circuits 405(0) through 405(31) in a vertical block. It is thus possible to reduce the transistors. The latch circuit cannot be commonly provided, and so the DPB circuit 304 includes 32 latch circuits 405(0) through 405(31). The latch circuits 405(0) through 405(31) latch the protection information.

The decode circuit 404 includes NAND circuits 440 and 441 and inverters 442 and 443. Each of the latch circuits 405(0) through 405(31) includes NMOS transistors 420 through 425 and inverters 426 and 427. The output circuit 406 includes inverters 430 through 432, a NOR circuits 433, a PMOS transistor 434, and a NMOS transistor 435. The output circuit 406 outputs the latched information of the latch circuits 405(0) through 405(31) commonly provided to the multiple latch circuits 405(0) through 405(31).

The internal sector decode signal GSELg and the signal D_LOCK are input into the NAND circuit 440. The internal sector decode signal GSELg selects the vertical block of 32 sectors. The signal D_LOCK sets the sector protect bit. In the decode circuit 404, the NAND circuit 440 performs the NAND operation of the input signal GSELg and the signal D_LOCK, and inputs the signal SELXB into the inverter 442. The inverter 442 outputs the signal LOCK to invert the signal SELXB and set the protect bit.

The sector decode signal GSELg and the signal D_UN-LOCK are input into the NAND circuit 441. The internal sector decode signal GSELg selects the vertical block composed of 32 sectors. The signal D_UNLOCK clears the sector protect bit. The NAND circuit 441 performs the NAND operation of the signal GSELg and the signal D_UN-LOCK, and inputs the signal SELXDB is input into the inverter 443. The inverter 443 inverts the signal SELXDB and outputs the signal UNLOCK to clear the sector protect bit.

In the output circuit 406, NMOS transistors 434 and 435 are connected in series between the inverters 431 and 432 and the ground. The gate of the NMOS transistor 420 is controlled by the signal LOCK that sets the protect bit. The gate of the NMOS transistor 422 is controlled by the signal UNLOCK that clears the sector protect bit. The gates of the NMOS transistors 421 and 424 are controlled by the internal sector decode signals HSEL(0) through HSEL(31), which select one of the 32 sectors. The gate of the NMOS transistor 423 is controlled by the output from the latch composed of the inverters 426 and 427. The gate of the NMOS transistor 425 is controlled by the signal ADPB_CLR.

The signal ADPB_CLR is High after the power on, and the latch of the inverters 426 and 427 is reset. The output circuit 406 includes inverters 430 through 432, a NOR circuit 433, a PMOS transistor 434, and a NMOS transistor 435. The internal sector decode signal GSELg, which selects the vertical block composed of the 32 sectors, is input into the inverter 430 in the output circuit 406.

For example, if the zeroth sector in a vertical block is protected, LK(0) is High. A rewrite command is input, the internal address is modified, and the signal GSELg becomes High. High is output from the second inverter (with weak Pch) 431 that receives the signal GSELg. However, if the signal HSEL(0) is High and the zeroth sector is selected, the NMOS transistors 423 and 424 turn ON because LK(0) is High. The signal DPBqv is strongly pulled down to the ground and becomes Low. The NMOS transistor 435 turns ON, and the signal DPBOUTB becomes Low. The sector is thus protected. The decode circuit 404 and the output circuit 406 are commonly provided to the latch circuits 405(0) through 405(31) corresponding to the sector included in the given vertical block.

Figure 12:
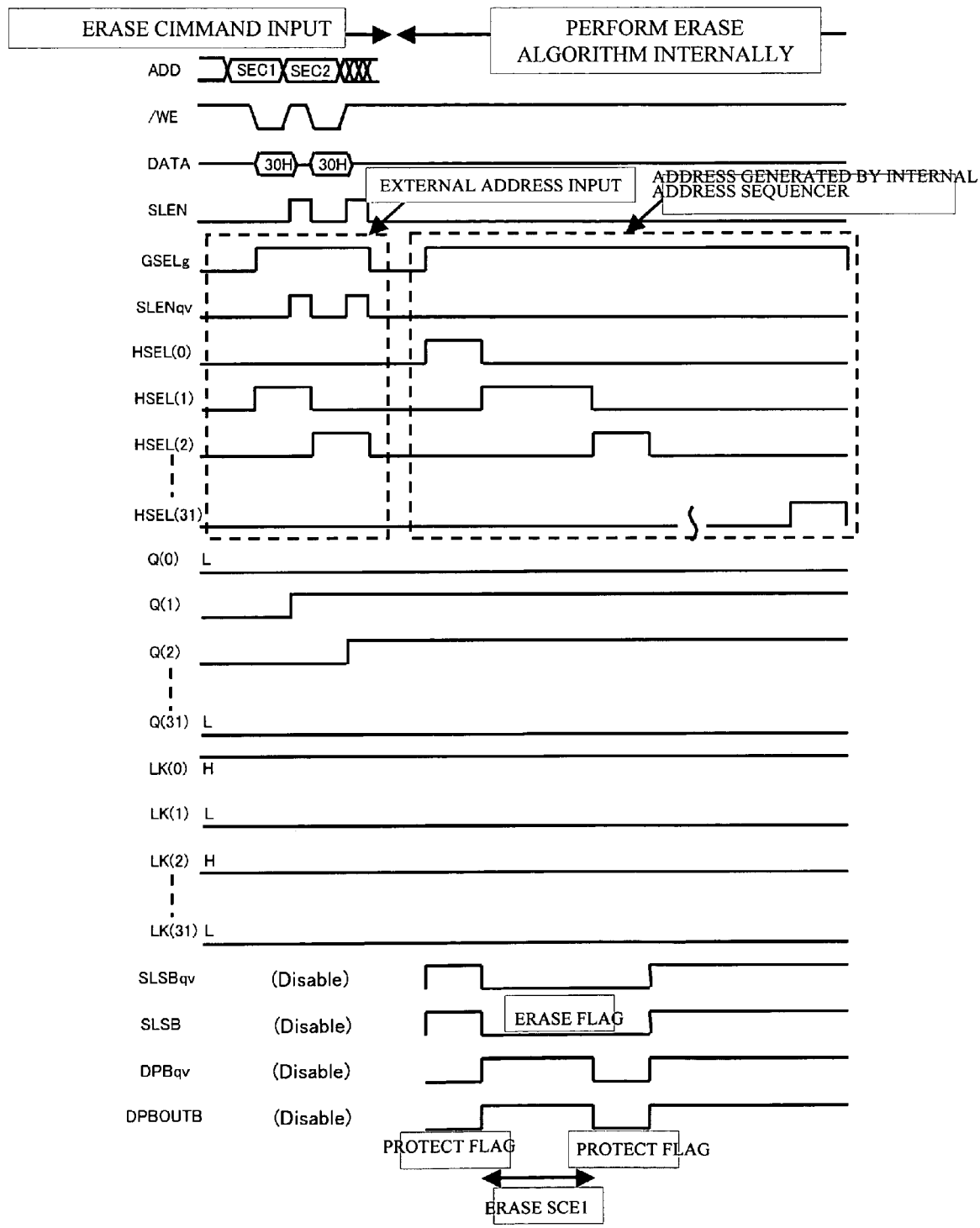
FIG. 12 is a timing chart.

Next, a description will be given of the operation of the semiconductor device 301 in accordance with the second embodiment. FIG. 12 is a timing chart. A description will be given with reference to FIG. 9, too. As shown in FIG. 12, some of the signal GSELg, the signal SLENqv, and the signals HSEL(0) through HSEL(31) are generated by the external address input. Others are generated by the addresses internally generated by the address sequencer 11. While the command is being input from the outside, waveforms of the signals are disabled.

The sector protection information for rewriting is set in the DPB circuit 304 in advance. The DPB circuit 304 is provided to every sector. One DPB circuit is provided to multiple sectors in some cases. In the DPB circuit 304, for example, assuming that a flag (*) is set to protect a sector 0 and a sector 2. An erase command is input into the control circuit 10. 30H denotes a command that erases the sector. Here, the sector address to be erased is sequentially input.

A sector address (SECn) is input from the outside, the sector address is latched in the address buffer 7 when /WE becomes Low. A SLEN pulse generated when /WE becomes High and the latched addresses thereof (GSELg and HSEL (N)) set the latch in the sector latch circuit 305. For example, the sector addresses of the sector 1 and the sector 2 are input, and the flag (*) showing the erase is sequentially set to the latch that corresponds to the sector latch circuit 305, from the address buffer 7. That is, a node Q in the latch circuit shown in FIG. 10 is set to High. The control circuit 10 controls a series of the erase operation according to erase algorithm, when the inputs of all the sector addresses are completed.

Specifically, the address sequencer 11 sequentially generates the sector addresses from the sector 0 through the sector Sn, and the control circuit 10 accesses the DPB circuit 304 and the sector latch circuit 305 that correspond to the generated address every time (which is referred to as search by the address sequencer), and then sequentially erases the sector actually after judging whether or not the sector should be erased. For example, the address sequencer 11 generates a sector address A0 and searches DPB0 and SL0 (DPB0 corresponds to LK(0) and SL0 corresponds to Q(0)).

If the signal GSELg is High, the second inverter (with weak Pch) 381 that receives the signal GSELg outputs High. However, if signals HSEL(1) through HSEL(31) are modified and HSEL(1) and HSEL(2) are selected in the meantime, the signal SLSBqv is strongly pulled down to the ground and is turned to Low, because Q(1) and Q(2) are High. If the signal GSELg is High, the second inverter (with weak Pch) 431 that receives the signal GSELg outputs High. However, if the signals HSEL(0) and HSEL(2) are selected in the meantime, the signal DPBqv is strongly pulled down to the ground to become Low, because LK(0) and LK(2) are High.

Then, the DPB0 with the protection flag and the SL0 without the protection flag are respectively input into the control circuit 10 from the DPBOUTB signal line and SLSB signal line. The control circuit 10 receives the signal showing that the signal SLSB is not erased (the DPBOUTB is not protected for rewriting simultaneously), and the sector 0 is not erased. Consequently, the address sequencer 11 generates a next sector address A1 and searches the DPB1 and SL1. Then, the DPB 1 having the protection flag and the SL1 having the erase flag are respectively input into the control circuit 10. The control circuit 10 receives that the signal DPBOUTB does not have the protection for rewriting and the signal SLSB shows the erase, and then erases the sector 1.

That is to say, the control circuit 10 outputs the signal ERSTRESS to the erase circuit 13, and the erase circuit 13 applies the erase stress to all the cells in the sector S1. Also, in fact, before the erase stress is applied (before the generation of the ERSTRESS signal), a pre-programming is performed in the sector to be programmed, however. However, this is omitted for simplification.

After the erase stress is applied, the control circuit 10 confirms that the erasing is performed as a result of the erase verify operation, and the address sequencer 11 generates a next sector address A2 to search the DPB2 and SL2. Then, the DPB2 having the protection flag and the SL2 having the erase flag are respectively input into the control circuit 10. In FIG. 9, a verify circuit is omitted for simplification.

The control circuit 10 receives the signal DPBOUTB having a protection for rewriting, and (even if the signal SLSB shows the erase) the sector 2 is not to be erased. Consequently, the address sequencer 11 generates the next sector address and performs the same operation to the sector n. Thus, a series of erase operation is completed.

Here, a description will be given of the signal SLSDB. If the reading operation is performed on an address designated from the outside while the erasing is being performed, the sector addresses (GSELD, HSELD) are input into the sector latch circuit 305. If the address is being erased (the node Q is High and the signal SLSDB is Low in the sector latch circuit 305), the signal SLSDB showing the erasing becomes Low. The control circuit 10, after receiving the signal, outputs the toggle data to the outside of the chip through the I/O buffer 8. However, this function has already been existent as one of the functions to know the status of whether or not the user is erasing the chip.

In accordance with the second embodiment, in the DPB circuit 304 and the sector latch circuit 305, a minimally necessary latch is remained by the sector and the output is multiplexed (32 sectors). It is thus possible to reduce the number of the transistors. The output signals of the latch circuits for 16 sectors are pulled up, by selecting the vertical block. The horizontal block is selected, the latch information in one sector out of the 16 sectors is read, and the pulled up signals are pulled down. It is thus possible to read the information in one sector out of 32 sectors. The pulled down sector becomes the erase sector information for erase and the sector protection information for protection.

The second embodiment is summarized as follows. The semiconductor device 301 includes the memory cell array 2 that includes memory cells for storing data and is managed on a sector basis, a sector latch circuit 305 (the DPB circuit 304) including multiple first circuits 352 (405) and a second circuit 351 (404), and the control circuit 10 that controls said each sector according to the information latched in each of the first circuits 352 (405). Each of the multiple first circuits latches information (the sector protection information or the protection information) on each sector. The second circuit 351 (404) is commonly provided to the multiple first circuits and decodes an address. On the semiconductor device 301, the sector latch circuits 305 (the DPB circuit 304) further includes third circuits 353 and 354 (406) commonly provided to the first circuits 352 (405), and outputs the information latched in the first circuits 352 (405).

Figure 13:
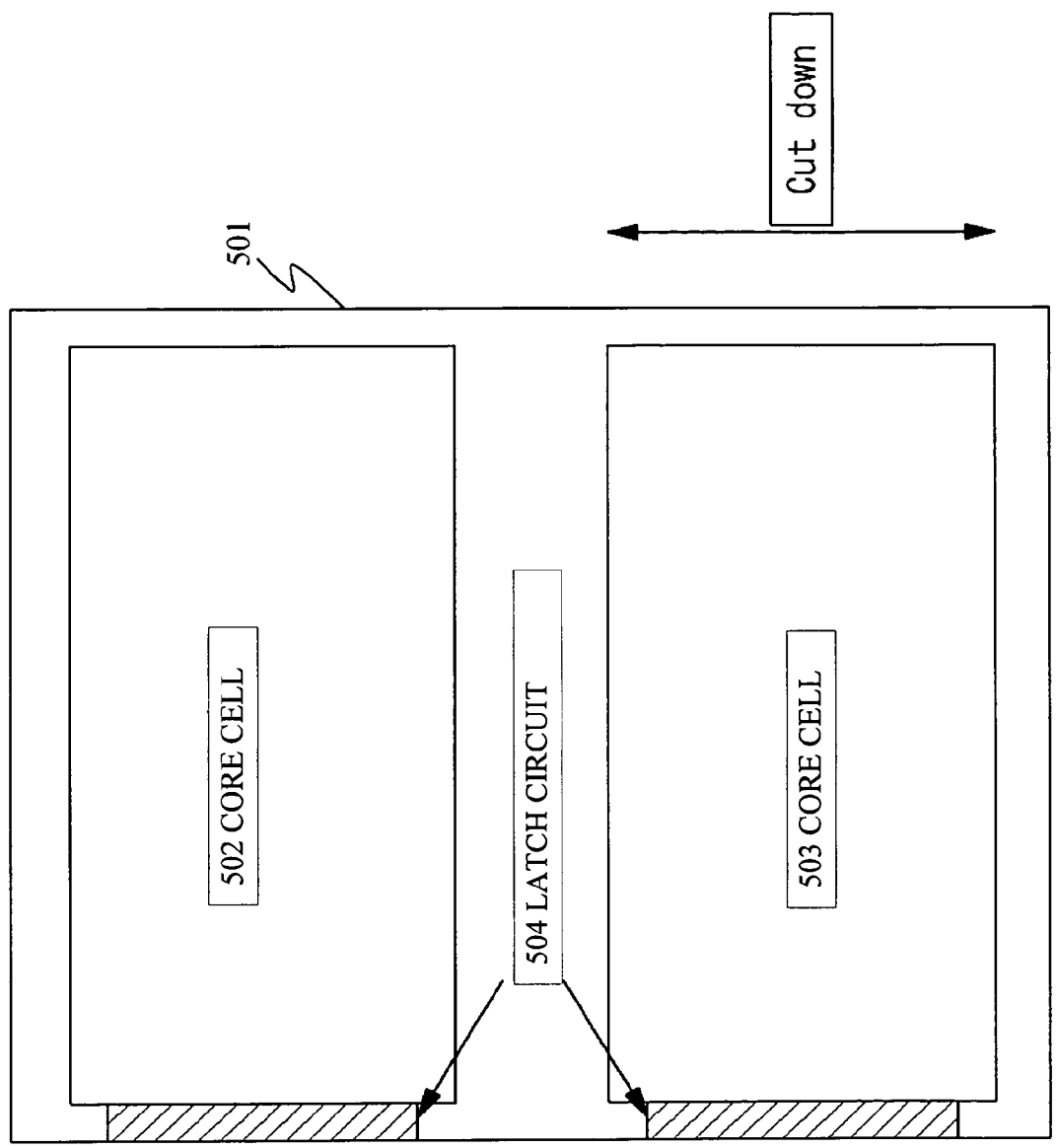
FIG. 13 shows a layout of the semiconductor device in accordance with the second embodiment.

With the above-mentioned configuration, there are following advantages. FIG. 13 shows a layout of the semiconductor device in accordance with the second embodiment. FIG. 13 is a layout configuration after the circuit is modified. In FIG. 13, a reference numeral 501 indicates a whole chip, reference numerals 502 and 503 indicate core cells, and a reference numeral 504 indicates a latch circuit. The latch circuit 504 includes the DPB circuit 304 and the sector latch circuit 305, as described. The latch circuit 504 is arranged next to the core cells 502 and 503. This can facilitate the circuit design when the semiconductor device is cut down. The latch circuit 504 together with an unnecessary sector array can be eliminated if the semiconductor device is cut down. Moreover, the whole circuit is small and the layout area can be reduced, too. Further, the commonly used decodes, multiplexed outputs, and integration of the circuits can make the layout area smaller to approximately 37 percent, which is smaller than half, as compared in the number of the transistors.

The first embodiment and the second embodiment may be combined. The DPB circuit 4 of the first embodiment shown in FIG. 2 may be configured same as the DPB circuit 304 shown in FIG. 11. In this case, the DPB circuit 4 includes the multiple first circuits 405 that respectively latch the activation information of the sectors and the second circuit 404 that decodes the address commonly provided to the multiple first circuits 405. The DPB circuit 4 further includes the third circuit 406 that outputs the information commonly provided with the multiple first circuits 405 and latched in the first circuit 405.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:
1. A semiconductor device comprising:
a memory storing information that determines an activated state;
a latch circuit that latches activation information based on the information stored in the memory;
an activation control circuit causing the latch circuit to latch the activation information by referring to the memory when a given command is input after activation, wherein, when the memory is in an erased state, the activation control circuit produces a reset signal that resets the latch circuit.

2. The semiconductor device as claimed in claim 1, wherein the activation control circuit causes the latch circuit to latch the activation information when the given command is first input.

3. The semiconductor device as claimed in claim 1, wherein, when the memory is in a programmed state, the activation control circuit produces a given set signal that causes the activation information to be written into the latch circuit.

4. The semiconductor device as claimed in claim 1, further comprising a memory cell array that includes memory cells for storing data and is managed on a sector basis, wherein the latch circuit latches the activation information on the sector basis.

5. The semiconductor device as claimed in claim 4, wherein the latch circuit latches a single piece of the activation information for multiple sectors.

6. The semiconductor device as claimed in claim 4, wherein the given command is a write command.

7. The semiconductor device as claimed in claim 4, wherein the information that is stored in the memory and determines the activated state includes information indicating whether each sector should be activated in a protected state or in an unprotected state.

8. The semiconductor device as claimed in claim 4, wherein the memory is a content addressable memory.

9. The semiconductor device as claimed in claim 4, further comprising an erase circuit that erases data in the memory cells in the memory cell array on the basis of the activation information latched in the latch circuit.

10. The semiconductor device as claimed in claim 9, further comprising a control circuit that controls erasing by the erase circuit on the basis of the activation information latched in the latch circuit.

11. The semiconductor device as claimed in claim 4, wherein the latch circuit comprises:
first circuits that latch the activation information on the sector basis; and
a second circuit that is commonly provided to the first circuits and decodes an address.

12. The semiconductor device as claimed in claim 11, wherein the latch circuit further comprises a third circuit that is commonly provided to the first circuits and outputs the activation information latched in the first circuits.

13. A semiconductor device comprising:
a memory storing information that determines an activated state;
a latch circuit that latches activation information based on the information stored in the memory;
an activation control circuit causing the latch circuit to latch the activation information by referring to the memory when a given command is input after activation;
wherein, in a case where the activation control circuit causes the activation control circuit to latch the activation information when a power supply voltage is equal to or lower than a predetermined voltage, the activation control circuit causes the activation control circuit to latch the given command again when the given command is input again.

14. A semiconductor device comprising:
a memory storing information that determines an activated state;
a latch circuit that latches activation information based on the information stored in the memory;
an activation control circuit causing the latch circuit to latch the activation information by referring to the memory when a given command is input after activation;
wherein, in a case where the activation control circuit causes the activation control circuit to latch the activation information when a power supply voltage is higher than a given power supply voltage, the activation control circuit does not cause the activation control circuit to latch the given command even when the given command is input again.

15. A semiconductor device comprising:
a memory storing information that determines an activated state;
a latch circuit that latches activation information based on the information stored in the memory;
an activation control circuit causing the latch circuit to latch the activation information by referring to the memory when a given command is input after activation;
further comprising a memory cell array that includes memory cells for storing data and is managed on a sector basis, wherein the latch circuit latches the activation information on the sector basis;
further comprising a second memory cell array having memory cells for storing sector protection information, wherein the control circuit determines whether the memory cell array should be erased on the basis of the activation information latched in the latch circuit and the sector protection information stored in the second memory cell array.

16. A semiconductor device comprising:
a memory cell array that includes memory cells for storing data and is managed on a sector basis;
a latch circuit including first circuits each latching information on a respective sector of the memory cell array, and a second circuit that is commonly provided to the first circuits and decodes an address; and
a control circuit controlling sectors of the memory cell array on the basis of the information latched in the first circuits.

17. The semiconductor device as claimed in claim 16, wherein the latch circuit further comprises a third circuit that is commonly provided to the first circuits and outputs the information latched in the first circuits.

18. The semiconductor device as claimed in claim 17, wherein the third circuit is commonly provided to the first circuits respectively corresponding to sectors in a given block.

19. The semiconductor device as claimed in claim 16, wherein the second circuit is commonly provided to the first circuits respectively corresponding to sectors in a given block.

20. The semiconductor device as claimed in claim 16, wherein the information on the respective sector is sector protection information.

21. The semiconductor device as claimed in claim 16, wherein the information on the respective sector is erase information.

22. The semiconductor device as claimed in claim 16, wherein the control circuit controls programming or erasing of a sector in the memory cell array on the basis of the information latched in the latch circuit.

23. A semiconductor device comprising:
a memory cell array that includes memory cells for storing data and is managed on a sector basis;

a latch circuit including first circuits each latching information on a respective sector of the memory cell array, and an additional circuit that is commonly provided to the first circuits and outputs the information latched in the first circuits; and a control circuit controlling sectors of the memory cell array on the basis of the information latched in the first circuits.

* * * * *